United States Patent
Takita

(10) Patent No.: US 7,187,604 B2
(45) Date of Patent: Mar. 6, 2007

(54) SEMICONDUCTOR MEMORY

(75) Inventor: Masato Takita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/291,777

(22) Filed: Dec. 2, 2005

(65) Prior Publication Data
US 2006/0098504 A1 May 11, 2006

Related U.S. Application Data

(63) Continuation of application No. PCT/JP03/10931, filed on Aug. 28, 2003.

(51) Int. Cl.
*G11C 8/00* (2006.01)
*G11C 29/00* (2006.01)

(52) U.S. Cl. ............... 365/200; 365/230.06; 365/201; 365/222; 365/240

(58) Field of Classification Search ................ 365/200, 365/222, 78, 189.05, 189.12, 225.7, 240, 365/239; 711/109
See application file for complete search history.

(56) References Cited

U.S. PATENT DOCUMENTS 4,989,181 A * 1/1991 Harada .................. 365/200
5,200,707 A * 4/1993 Weaver .................. 330/10
5,479,370 A * 12/1995 Furuyama et al. ..... 365/189.12
5,968,190 A * 10/1999 Knaack .................. 714/719
2002/0001246 A1* 1/2002 Hidaka .................. 365/222
2003/0043672 A1 3/2003 Inoue et al.

FOREIGN PATENT DOCUMENTS

| JP | 11-120790 A | 4/1999 |
| JP | 2000-311487 A | 11/2000 |
| JP | 2002-8370 A | 1/2002 |
| JP | 2003-68071 A | 3/2003 |

\* cited by examiner

*Primary Examiner*—Anh Phung
*Assistant Examiner*—Douglas King
(74) *Attorney, Agent, or Firm*—Arent Fox LLP

(57) ABSTRACT

A shift register includes plural latches corresponding to normal word lines of normal memory cell rows and a redundancy word line of a redundancy memory cell row, respectively, in order to sequentially activate any of the redundancy word line and the normal word lines upon every refresh request. An activation circuit activates any of the normal word lines and redundancy word line according to an output of the shift register. A first storing circuit stores in advance a defect address indicating a defective normal memory cell row. A first activation control circuit prohibits activation of a normal word line corresponding to the defect address stored in the first storing circuit when the output of the shift register indicates the normal word line.

19 Claims, 13 Drawing Sheets

SEMICONDUCTOR MEMORY

CROSS REFERENCE TO RELATED APPLICATION

This application is a continuation application of International Application PCT/JP03/10931, filed Aug. 28, 2003, and designating the U.S.

BACKGROUND OF THE INVENTION

1. Field of the Invention

The present invention relates to a semiconductor memory that requires a regular refresh operation.

2. Description of the Related Art

A semiconductor memory such as a DRAM (Dynamic Random Access Memory) has a redundancy memory cell row (redundancy circuit) for relieving defects of memory cell rows occurring in a process of manufacturing semiconductor memories in order to increase a yield and reduce chip costs. Defects of memory cell rows are relieved by replacing defective memory cell rows with redundancy cell rows in a test process.

One example of methods of replacing defective memory cell rows with redundancy memory cell rows may include a replace redundancy method. A semiconductor memory employing the replace redundancy method has a ROM (Read Only Memory) such as a fuse circuit that stores addresses of defective memory cell rows. In the replace redundancy method, the ROM has a high degree of freedom for its arrangement since word lines (word drivers) are connected to a word decoder without the ROM. For this reason, for example, if the semiconductor memory has a plurality of memory cell arrays, it is easy to form the word decoder in common. Accordingly, the replace redundancy method is effective for the reduction of a chip size.

On the other hand, in a DRAM or the like, a memory cell requires a refresh operation for rewriting data of the memory cell at a regular period since the memory cell stores the data by means of charges accumulated in a capacitor. A semiconductor memory employing a shift refresh method in order to reduce power consumption during a refresh operation is disclosed in Japanese Unexamined Patent Application Publication No. 2000-311487, for example. This kind of semiconductor memory sequentially selects word lines to be refreshed by using a shift register during the refresh operation. Accordingly, there is no need of a refresh address generating circuit, such as a refresh counter, and a switching circuit for switching between an external address and a refresh address. As a result, it is possible to reduce an increase in the chip size and power consumption during a refresh operation.

The inventor has studied the introduction of the shift refresh method into a semiconductor memory that employs the replace redundancy method. If the shift refresh method is simply applied to the semiconductor memory that employs the replace redundancy method, defective memory cell rows are refreshed while redundancy memory cell rows are in use, or the redundancy memory cell rows are refreshed while the redundancy memory cell rows are not in use. Since word lines that require no activation are activated during a refresh operation, a charge and discharge current is unnecessarily consumed. That is, the effect of reducing power consumption by the shift refresh method during the refresh operation is lowered. In addition, the activation of word lines of the defective memory cell rows during the use of the redundancy memory cell rows may cause stored data in other memory cell rows to be destroyed if the defects of the memory cell rows are due to a word decoder or a short between word lines, between word lines and bit lines, or between memory cells.

SUMMARY OF THE INVENTION

It is an object of the invention to reduce power consumption, particularly, power consumption during a self-refresh mode, of a semiconductor memory employing a shift refresh method.

In one aspect of a semiconductor memory of the invention, a memory cell array includes a plurality of normal memory cell rows and a redundancy memory cell row. Each of the plurality of normal memory cell rows includes a normal word line and a normal memory cell connected to the normal word line. The redundancy memory cell row includes a redundancy word line and a redundancy memory cell that both relieve defects of the normal memory cell rows. The redundancy memory cell is connected to the redundancy word line. A shift register is composed of a plurality of latches corresponding to the normal word lines and the redundancy word line, in order to sequentially activate any of the redundancy word line and the normal word lines upon every refresh request. An activation circuit activates any of the normal word lines and the redundancy word line according to an output of the shift register. A first storing circuit stores in advance a defect address indicating a defective normal memory cell row when there is a defect in any of the normal memory cell rows. A first activation control circuit prohibits activation of a normal word line corresponding to the defect address stored in the first storing circuit when the output of the shift register indicates the normal word line corresponding to the defect address.

With this configuration, when there is a defect in one of the normal memory cell rows and the first storing circuit stores the defect address, it is possible to prevent activation of a normal word line of the defective normal memory cell row in the semiconductor memory employing the shift refresh method in which word lines to be refreshed are sequentially selected using the shift register. Accordingly, it is possible to prohibit the refresh to the defective normal memory cell row and prevent unnecessary consumption of a charge and discharge current in the refresh operation. In addition, employing the shift refresh method, the semiconductor memory does not need to have a refresh address generating circuit and a switching circuit switching between an external address and a refresh address. This can reduce the chip size of the semiconductor memory and enable execution of the refresh operation in a short time. The unnecessity to include the refresh address generating circuit and the switching circuit and the prohibition of the refresh to the defective normal memory cell row realize reduction in the power consumption during the refresh operation. During the self-refresh mode in which refresh operation is regularly repeated, the semiconductor memory consumes power mostly for the refresh operation. Therefore, the invention is particularly effective for the reduction of the power consumption during the self-refresh mode. In addition, the normal word line of the defective normal memory cell row is not activated, so that it is possible to prevent destruction of stored data in other normal memory cell rows in a case in which the defect of the normal memory cell row is caused by a word decoder or a short between the normal word lines, between the normal word line and the bit line, or between the normal memory cells.

In another aspect of the semiconductor memory of the invention, preferably, a first comparing circuit activates a defect coincidence signal when the output of the shift register indicates the normal word line corresponding to the defect address stored in the first storing circuit. A permission circuit of the first activation control circuit stops an output operation of a permission signal to activate the activation circuit during activation of the defect coincidence signal, and outputs the permission signal during inactivation of the defect coincidence signal. For example, a permission signal generating circuit of the permission circuit generates the permission signal in response to the refresh request or an access request. A mask circuit of the permission circuit masks the permission signal during the activation of the defect coincidence signal. Accordingly, the activation of the word lines can be easily controlled only by activating and inactivating the activation circuit using the permission signal.

Further, in another aspect of the semiconductor memory of the invention, preferably, the first comparing circuit includes a plurality of decoders which are respectively provided corresponding to the latches, and a wired OR circuit. The decoders receive the defect address stored in the first storing circuit to output coincidence detection signals when a latch corresponding to the defect address is activated. The wired OR circuit activates the defect coincidence signal when one of the coincidence detection signals is output. Since the defect coincidence signal is generated by using the wired OR circuit, the delay time of the defect coincidence signal can be reduced and the defect coincidence signal can be generated with a simple circuit, as compared to a case where the defect coincidence signal is generated by using OR gates at a plurality of stages, for example.

Furthermore, in another aspect of the semiconductor memory of the invention, preferably, a first comparing circuit activates a defect coincidence signal when the output of the shift register indicates the normal word line corresponding to the defect address stored in the first storing circuit. A shift control circuit of the first activation control circuit outputs a shift control signal once in response to the refresh request when the defect coincidence signal is not activated. The shift control signal is for making the shift register perform a shift operation. The shift control circuit of the first activation control circuit consecutively outputs the shift control signal twice in response to the refresh request when the defect coincidence signal is activated.

For example, a first pulse generating circuit of the shift control circuit outputs a first pulse signal in response to the refresh request. A second pulse generating circuit of the shift control circuit outputs a second pulse signal not overlapping with the first pulse signal, when the defect coincidence signal is activated. For example, a delay circuit of the second pulse generating circuit outputs the first pulse signal with a delay as the second pulse signal. A prohibition circuit of the second pulse generating circuit prohibits the first pulse signal from being supplied to the delay circuit during inactivation of the defect coincidence signal. An OR circuit of the shift control circuit performs an OR operation on the first and second pulse signals to output a result of the OR operation as the shift control signal.

With this configuration, upon activation of the defect coincidence signal, a word line indicated by the output of the shift register can be immediately changed from the normal word line corresponding to the defect address to a next word line. This can accordingly reduce the number of times of refresh requests required to refresh the entire memory cell array as well as the frequency at which a refresh request occurs. Since the frequency at which a generating circuit of the refresh request is activated can be reduced, power consumption in the refresh operation (particularly, the self-refresh mode) can be reduced.

Further, in another aspect of the semiconductor memory of the invention, preferably, a second storing circuit stores use/nonuse of the redundancy memory cell row in advance. A second activation control circuit prohibits activation of the redundancy word line when the second storing circuit stores the nonuse of the redundancy memory cell row and the output of the shift register indicates the redundancy word line. Accordingly, when all normal memory cell rows are normal and the second storing circuit stores the nonuse of the redundancy memory cell row, the redundancy word line of the redundancy memory cell row can be prevented from being activated. As a result, it is possible to prohibit the refresh to the redundancy memory cell row and prevent unnecessary consumption of a charge and discharge current in the refresh operation. Accordingly, power consumption in the refresh operation can be reduced even while the redundancy memory cell row is not in use.

Furthermore, in another aspect of the semiconductor memory of the invention, preferably, a second comparing circuit activates a redundancy coincidence signal when the second storing circuit stores the nonuse of the redundancy memory cell row and the output of the shift register indicates the redundancy word line. A permission circuit of the second activation control circuit stops an output operation of a permission signal to activate the activation circuit during activation of the redundancy coincidence signal, and outputs the permission signal during inactivation of the redundancy coincidence signal. For example, a permission signal generating circuit of the permission circuit generates the permission signal in response to the refresh request or an access request. A mask circuit of the permission circuit masks the permission signal during the activation of the redundancy coincidence signal. Accordingly, the activation of the word lines can be easily controlled only by activating and inactivating the activation circuit using the permission signal.

Moreover, in the semiconductor memory of the invention, preferably, a second comparing circuit activates a redundancy coincidence signal when the second storing circuit stores the nonuse of the redundancy memory cell row and the output of the shift register indicates the redundancy word line. A shift control circuit of the second activation control circuit outputs a shift control signal once in response to the refresh request when the redundancy coincidence signal is not activated. The shift control signal is for making the shift register perform a shift operation. The shift control circuit of the second activation control circuit consecutively outputs the shift control signal twice in response to the refresh request when the redundancy coincidence signal is activated.

For example, a first pulse generating circuit of the shift control circuit outputs a first pulse signal in response to the refresh request. A second pulse generating circuit of the shift control circuit outputs a second pulse signal not overlapping with the first pulse signal, when the redundancy coincidence signal is activated. For example, a delay circuit of the second pulse generating circuit outputs the first pulse signal with a delay as the second pulse signal. A prohibition circuit of the second pulse generating circuit prohibits the first pulse signal from being supplied to the delay circuit during inactivation of the redundancy coincidence signal. An OR circuit of the shift control circuit performs an OR operation on the first and second pulse signals to output a result of the OR operation as the shift control signal.

With this configuration, it is possible to immediately change a word line indicated by the output of the shift register from the redundancy word line to a next normal word line, upon the activation of the redundancy coincidence signal. As a result, it is possible to reduce the number of times of refresh requests required to refresh the entire memory cell array and to reduce the frequency of occurrence of refresh requests. Since the frequency at which a generating circuit of the refresh request is activated can be reduced, power consumption in the refresh operation (particularly, the self-refresh mode) can be reduced.

Further, in another aspect of the semiconductor memory of the invention, preferably, the first storing circuit includes a first fuse circuit that programs the defect address. The second storing circuit includes a second fuse circuit that programs use/nonuse of the redundancy memory cell row. Accordingly, fusing the first and second fuse circuits depending on a result of a test for semiconductor memory chips makes it possible to program the defect address and the use/nonuse of the redundancy memory cell row, respectively.

Furthermore, in another aspect of the semiconductor memory of the invention, preferably, a self-refresh control circuit generates the refresh request at a predetermined cycle to automatically refresh the normal memory cells and the redundancy memory cell at a predetermined cycle. That is, it is possible to reduce power consumption during the self-refresh mode in the semiconductor memory having the self-refresh mode.

In another aspect of the semiconductor memory of the invention, preferably, an output of a latch at the last stage of the latches is fed back to an input of a latch at the initial stage of the latches. That is, the latches of the shift register are connected in a loop. For example, each of the latches includes a reset terminal that receives a reset signal. One of the latches is initialized to an activation state in response to the reset signal. The rest of the latches are initialized to an inactivation state in response to the reset signal.

Accordingly, after activation of a word line corresponding to the latch at the last stage, the word lines can be sequentially activated again starting from a word line corresponding to a latch at the initial stage without a special processing for activating the latch at the initial stage. As a result, for example, the reset signal has only to be once supplied to the shift register when the semiconductor memory is powered on, thereby eliminating the necessity of re-initialization of the shift register.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
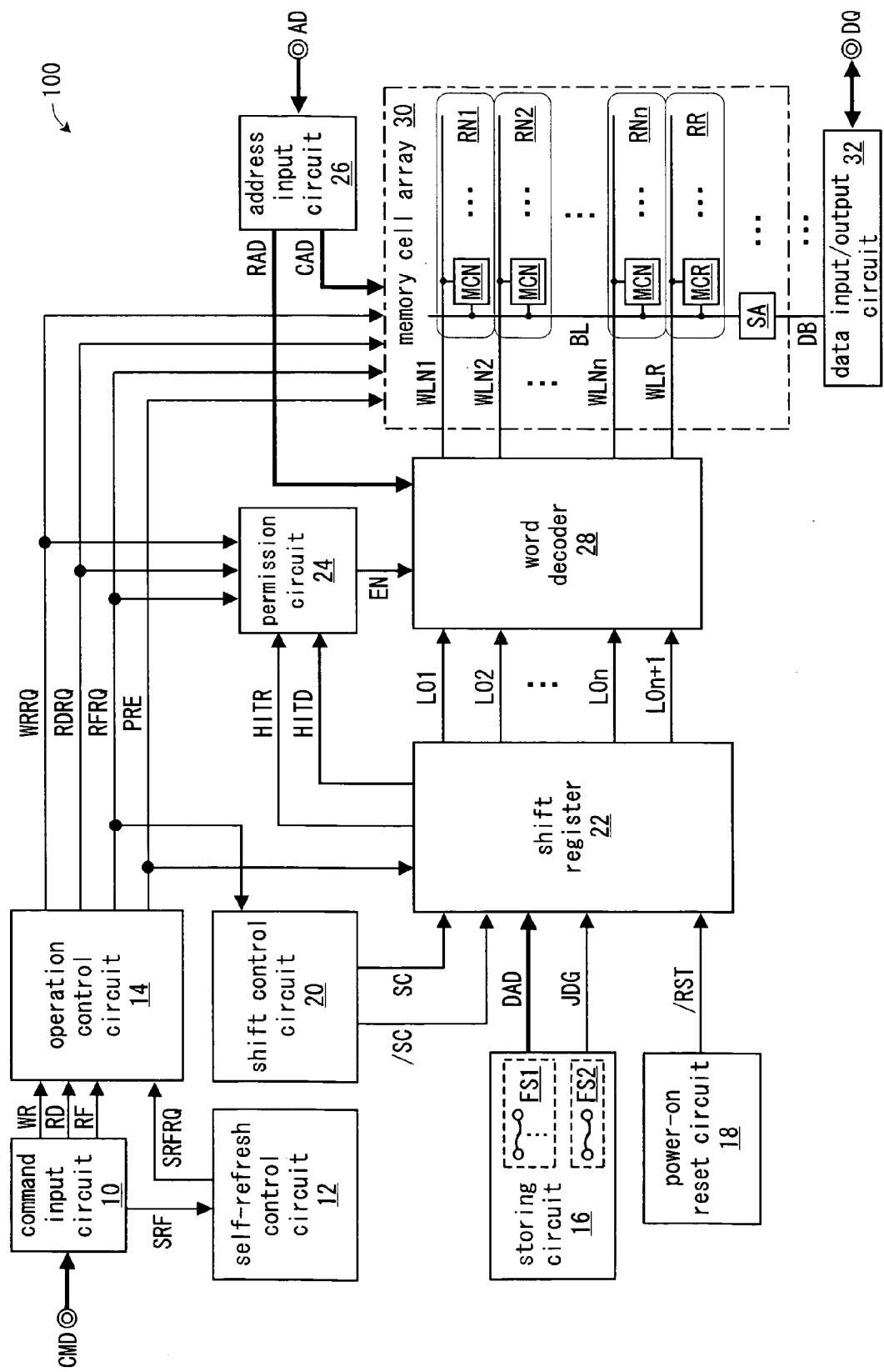
FIG. 1 is a block diagram illustrating a semiconductor memory according to a first embodiment of the invention.

Hereinafter, preferred embodiments of the invention will be described with reference to the accompanying drawings. In the drawings, a double circle represents an external terminal. A signal supplied through the external terminal is denoted by a reference numeral identical with a terminal name. A signal line carrying the signal is denoted by a reference numeral identical with a signal name. A signal indicated by a thick line represents a plurality of signals. The mark '/' prefixed with the signal name represents a negative logic.

FIG. 1 illustrates a semiconductor memory according to a first embodiment of the invention.

A semiconductor memory 100, which is for example a DRAM, includes a command input circuit 10, a self-refresh control circuit 12, an operation control circuit 14, a storing circuit 16, a power-on reset circuit 18, a shift control circuit 20, a shift register 22, a permission circuit 24, an address input circuit 26, a word decoder 28, a memory cell array 30, and a data input/out circuit 32.

The memory cell array 30 includes normal memory cell rows RN1 to RNn, a redundancy memory cell row RR, and a plurality of sense amplifiers SA. The normal memory cell rows RN1 to RNn include normal word lines WLN1 to WLNn and a plurality of normal memory cells MCN connected respectively to the normal word lines WLN1 to WLNn and a plurality of bit lines BL. The redundancy memory cell row RR includes a redundancy word line WLR and a plurality of redundancy memory cells MCR both for relieving defect of the normal memory cell rows RN1 to RNn, and the redundancy memory cells MCR are connected to the redundancy word line WLR and a plurality of bit lines BL. The normal memory cells MCN and the redundancy memory cells MCR, which are the same memory cell (dynamic memory cell), include capacitors for maintaining logical values of data with charges and transfer transistors connecting the capacitors to the bit lines BL, respectively. Gate electrodes of the transfer transistors are respectively connected to the normal word lines WLN1 to WLNn and the redundancy word line WLR. The sense amplifiers SA are provided corresponding to the bit lines BL, amplify read data transmitted to the bit lines BL during a read operation, and output the amplified read data to a data bus DB. In addition, the sense amplifiers SA amplify write data supplied through the data bus DB during a write operation and output the amplified write data to the bit lines BL.

The memory cell array 30 performs a write operation, a read operation, a refresh operation, and a precharge operation in response to a write request signal WRRQ, a read request signal RDRQ, a refresh request signal RFRQ, and a prechrage signal PRE, which are supplied from the operation control circuit 14, respectively.

The command input circuit 10 receives a command signal CMD through a command terminal CMD, and, based on the received command signal CMD, outputs one of a write signal WR for performing the write operation, a read signal RD for performing the read operation, a refresh signal RF for performing the refresh operation, and a self-refresh signal SRF for performing a self-refresh operation. The command signal CMD is a signal that controls the operation of DRAM, such as a row address strobe signal /RAS, a column address strobe signal /CAS, a write enable signal /WE, etc.

The self-refresh control circuit 12 operates during activation of the self-refresh signal SRF supplied from the command input circuit 10 and outputs a self-refresh request signal SRFRQ at a predetermined cycle.

The operation control circuit 14 outputs the write request signal WRRQ and the read request signal RDRQ in response to the write signal WR and the read signal RD supplied from the command input circuit 10, respectively. The operation control circuit 14 outputs the refresh request signal RFRQ in response to the refresh signal RF supplied from the command input circuit 10 and the self-refresh request signal SRFRQ supplied from the self-refresh control circuit 12. The operation control circuit 14 outputs the precharge signal PRE for resetting the bit lines BL of the memory cell array 30 with a predetermined voltage in response to the write signal WR, the read signal RD, the refresh signal RF and the self-refresh request signal SRFRQ.

The storing circuit 16 includes a first fuse circuit FS1 (first storing circuit) and a second fuse circuit FS2 (second storing circuit). When one of the normal memory cell rows RN1 to RNn is defective, the first fuse circuit FS1 is fused in a test process in order to program a defect address representing the defective normal memory cell row. When one of the normal memory cell rows RN1 to RNn is defective, the second fuse circuit FS2 is fused in a test process in order to program use of the redundancy memory cell row RR. The storing circuit 16 outputs a defect address signal DAD according to the fusing of the first fuse circuit FS1 and outputs a use judgment signal JDG according to the fusing of the second fuse circuit FS2. The power-on reset circuit 18 outputs a reset signal /RST when the semiconductor memory 100 is powered on.

The shift control circuit 20 outputs shift control signals SC and /SC that make the shift register 22 perform a shift operation in response to the refresh request signal RFRQ supplied from the operation control circuit 14.

The shift register 22 outputs a defect coincidence signal HITD when the use judgment signal JDG supplied from the storing circuit 16 indicates 'use' and its outputs LO1 to LOn+1 indicate a normal word line corresponding to the defect address signal DAD supplied from the storing circuit 16. In addition, the shift register 22 outputs a redundancy coincidence signal HITR when the use judgment signal JDG indicates 'nonuse' and the outputs LO1 to LOn+1 of the shift register 22 indicate the redundancy word line WLR. The shift register 22 initializes its outputs LO1 to LOn+1 in response to the reset signal /RST supplied from the power-on reset circuit 20. In addition, the shift register 22 initializes the defect coincidence signal HITD during inactivation of the precharge signal PRE supplied from the operation control circuit 14. Details of the shift register 22 will be described with reference to FIG. 2.

The permission circuit 24 (first and second activation control circuits) outputs a permission signal EN for activating the word decoder 28 in response to the write request signal WRRQ, the read request signal RDRQ and the refresh request signal RFRQ, which are supplied from the operation control circuit 14, during inactivation of the defect coincidence signal HITD and the redundancy coincidence signal HITR, which are supplied from the shift register 22. Details of the permission circuit 24 will be described with reference to FIG. 6.

The address input circuit 26 receives an address signal AD through an address terminal AD. For example, the semiconductor memory 100 employs an address multiplex method for receiving a row address signal RAD and a column address signal CAD in a two-divided manner. The row address signal RAD is output to the word decoder 28 in order to select one of the normal word lines WLN1 to WLNn and the redundancy word line WLR within the memory cell array 30 during an access operation. The column address signal CAD is output to the memory array 30 in order to select one of the bit lines BL within the memory cell array 30 during the access operation.

The word decoder 28 (activation circuit) activates a word line corresponding to the row address signal RAD among the normal word lines WLN1 to WLNn and the redundancy word line WLR in response to the permission signal EN during receipt of the row address signal RAD supplied from the address input circuit 26. In addition, the word decoder 28 activates a word line represented by the outputs LO1 to LOn+1 of the shift register 22 among the normal word lines WLN1 to WLNn and the redundancy word line WLR in response to the permission signal EN during non-receipt of the row address signal RAD.

The data input circuit 32 outputs data received through a data terminal DQ during the write operation to the data bus DB and outputs data read into the data bus DB during the read operation to the data terminal DQ.

Figure 2:
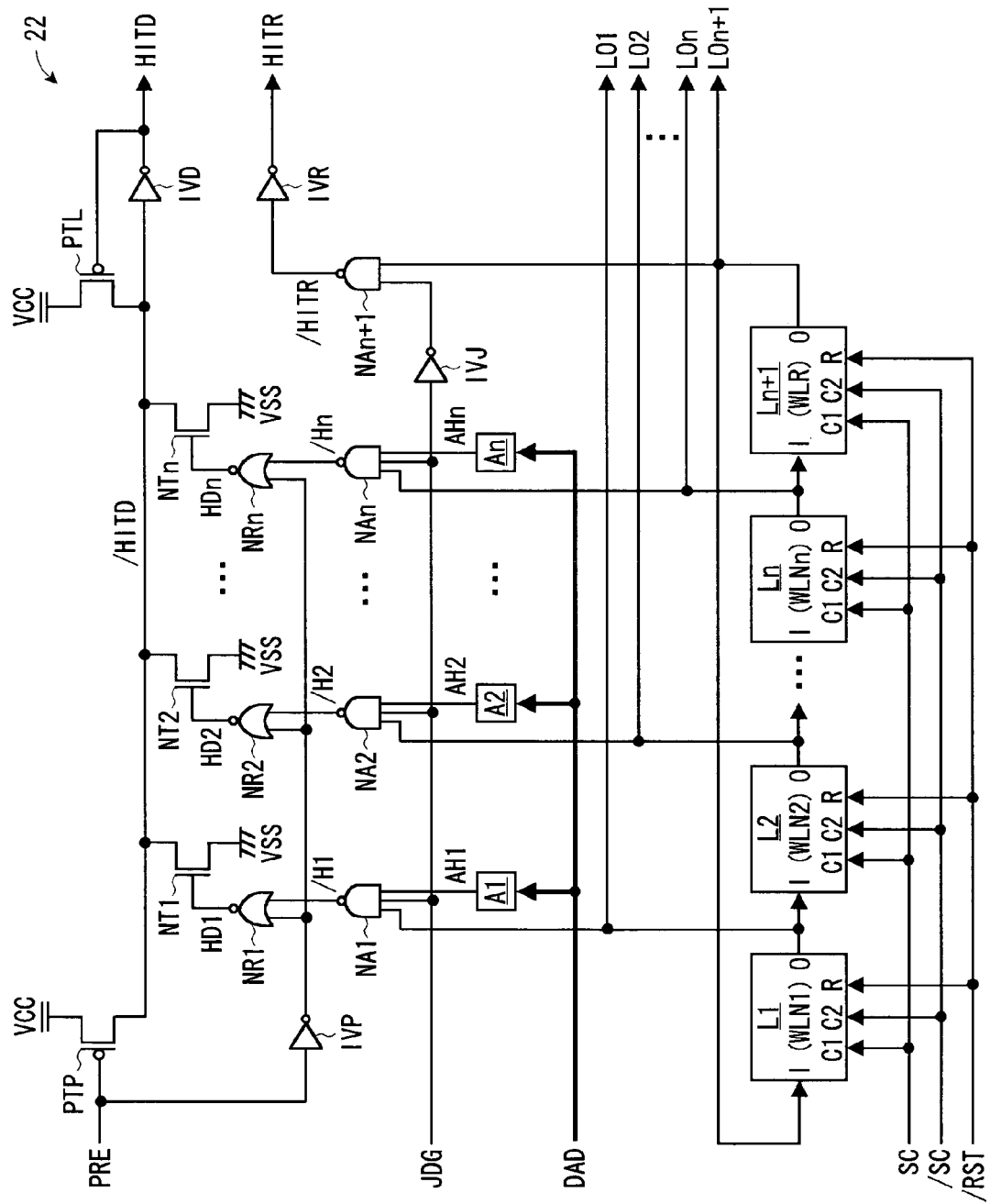
FIG. 2 is a circuit diagram illustrating details of a shift register according to the first embodiment.

FIG. 2 illustrates details of the shift register 22 according to the first embodiment. The shift register 22 includes latches L1 to Ln+1, AND array circuits A1 to An, NAND gates NA1 to NAn+1, NOR gates NR1 to NRn, nMOS transistors NT1 to NTn, pMOS transistors PTP and PTL, and inverters IVP, IVJ, IVD and IVR. In addition, a circuit composed of the AND array circuits A1 to An, the NAND gates NA1 to NAn, the NOR gates NR1 to NRn, the nMOS transistors NT1 to NTn, the pMOS transistors PTP and PTL, and the inverters IVP and IVD corresponds to a first comparing circuit. The AND array circuits A1 to An, the NAND gates NA1 to NAn, and the NOR gates NR1 to NRn correspond to n decoders of the first comparing circuit, respectively. A circuit composed of the nMOS transistors NT1 to NTn, the pMOS transistors PTP and PTL, and the inverter IVD corresponds to a wired OR circuit of the first comparing circuit. A circuit composed of the NAND gate NAn+1 and the inverters IVJ and IVR corresponds to a second comparing circuit.

The latches L1 to Ln+1 are provided corresponding to the normal word lines WLN1 to WLNn and the redundancy word line WLR within the memory cell array 30 (FIG. 1), respectively. The outputs LO1 to LOn+1 of the latches L1 to Ln are respectively connected to inputs of latches at next stages. The output LOn+1 of the latch Ln+1 at the last stage is fed back to an input of the latch L1 at the initial stage. That is, the latches L1 to Ln+1 are connected to one another in a loop shape. The latches L1 to Ln+1 latch outputs of the latches at previous stages, respectively, in response to the shift control signals SC and /SC supplied from the shift control circuit 20 (FIG. 1). The latch L1 is initialized to an activation state in response to the reset signal /RST supplied from the power-on reset circuit 18 (FIG. 1). The latches L2 to Ln+1 are initialized to an inactivation state in response to the reset signal /RST. Details of the latches L1 to Ln+1 will be described with reference to FIGS. 3 and 4.

The AND array circuits A1 to An are provided corresponding to the normal word lines WLN1 to WLNn, respectively. The AND array circuits A1 to An output address coincidence signals AH1 to AHn, respectively, when a normal word line corresponding to the defect address signal DAD supplied from the storing circuit 16 (FIG. 1) is coincident with one of the normal word lines WLN1 to WLNn.

The NAND gates NA1 to NAn are provided corresponding to the normal word lines WLN1 to WLNn, respectively. The NAND gates NA1 to NAn output coincidence signals /H1 to /Hn in response to activation of the outputs LO1 to LOn of the latches L1 to Ln when the use judgment signal JDG supplied from the storing circuit indicates 'nonuse' and the address coincidence signals AH1 to AHn indicate 'coincidence'.

The NOR gates NR to NRn are provided corresponding to the normal word lines WLN1 to WLNn, respectively. The NOR gates NR1 to NRn receive the precharge signal PRE supplied from the operation control circuit 14 (FIG. 1) through the inverter IVP and output the coincidence signals /H1 to /Hn as coincidence detection signals HD1 to HDn, respectively, during activation of the precharge signal PRE.

The nMOS transistors NT1 to NTn are provided corresponding to the normal word lines WLN1 to WLNn, respectively. The nMOS transistors NT1 to NTn are turned on during activation of the coincidence detection signals HD1 to HDn and connect a signal line /HITD to a ground line VSS in order to generate a defect coincidence signal /HITD.

The pMOS transistor PTP is turned on during inactivation of the precharge signal PRE and connects the signal line /HITD to a power supply line VCC in order to initialize the defect coincidence signal /HITD. The inverter IVD inverts the defect coincidence signal /HITD to output the defect coincidence signal HITD. The pMOS transistor PTL is turned on during inactivation of the defect coincidence signal HITR and connects a signal line /HITR to the power supply line VCC.

The NAND gate NAn+1 receives the use judgment signal JDG through the inverter IVJ and outputs a redundancy coincidence signal /HITR in response to activation of the output LOn+1 of the latch Ln+1 when the use judgment signal JDG indicates 'nonuse'. The inverter IVR inverts the redundancy coincidence signal /HITR to output the redundancy coincidence signal HITR.

Figure 3:
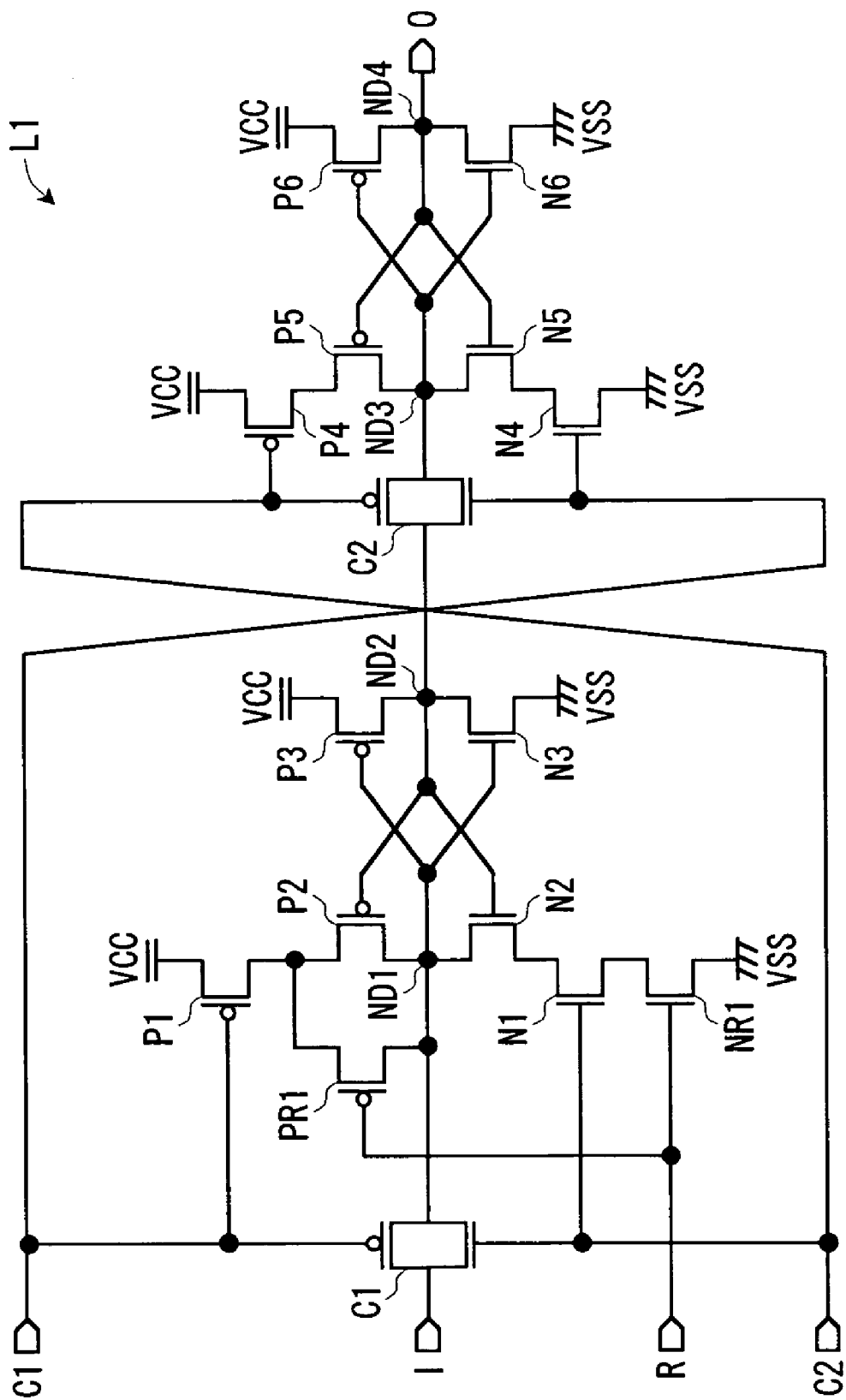
FIG. 3 is a circuit diagram illustrating details of a latch initialized to an activation state of the shift register according to the first embodiment.

FIG. 3 illustrates details of the latch L1 initialized to an activation state of the shift register 22 according to the first embodiment.

The latch L1 includes cMOS switches C1 and C2, pMOS transistors P1 to P6 and PR1, nMOS transistors N1 to N6 and NR1, an input terminal I, control terminals C1 and C2, a reset terminal R, and an output terminal O.

The pMOS transistors P1 and P2 and the nMOS transistors N2, N1 and NR1 are connected in series between the power supply line VCC and the ground line VSS. The pMOS transistor P3 and the nMOS transistor N3 are connected in series between the power supply line VCC and the ground line VSS. Gate electrodes of the pMOS transistor P3 and the nMOS transistor N3 are connected to a connection node ND1 between the pMOS transistor P2 and the nMOS transistor N2. Gate electrodes of the pMOS transistor P2 and the nMOS transistor N2 are connected to a connection node ND2 between the pMOS transistor P3 and the nMOS transistor N3. That is, the pMOS transistor P2, the nMOS transistor N2, the pMOS transistor P3, and the nMOS transistor N3 constitute a loop circuit. Gate electrodes of the pMOS transistor P1 and the nMOS transistor N1 receive the shift control signals SC and /SC supplied from the shift control circuit 20 (FIG. 1) through the control terminals C1 and C2, respectively. The pMOS transistor PR1 is connected in parallel to the pMOS transistor P2 between and the pMOS transistor P1 and the connection node ND1. Gate electrodes of the pMOS transistor PR1 and the nMOS transistor NR1 receive the reset signal /RST supplied from the power-on reset circuit 18 (FIG. 1) through the reset terminal R. The cMOS switch C1 is connected between the input terminal I, which receives the output Ln+1 of the latch Ln+1, and the connection node ND1 and receives the shift control signals SC and /SC.

The pMOS transistors P4 and P5 and the nMOS transistors N5 and N4 are connected in series between the power supply line VCC and the ground line VSS. The pMOS transistor P6 and the nMOS transistor N6 are connected in series between the power supply line VCC and the ground line VSS. Gate electrodes of the pMOS transistor P6 and the nMOS transistor N6 are connected to a connection node ND3 between the pMOS transistor P5 and the nMOS transistor N5. Gate electrodes of the pMOS transistor P5 and the nMOS transistor N5 are connected to a connection node ND4 between the pMOS transistor P6 and the nMOS transistor N6. That is, the pMOS transistor P5, the nMOS transistor N5, the pMOS transistor P6, and the nMOS transistor N6 constitute a loop circuit. The connection node ND4 is connected to the output terminal O through which the output LO1 of the latch L1 is output. Gate electrodes of the pMOS transistor P4 and the nMOS transistor N4 receive the shift control signals SC and /SC respectively. The cMOS switch C2 is connected between the connection node ND2 and the connection node ND3 and receives the shift control signals SC and /SC.

In the latch L1 constructed as above, when the shift control signal SC has a low level (the shift control signal /SC has a high level), an output level of a latch at a previous stage (the latch Ln+1) is input to the loop circuit composed of the pMOS transistors P2 and P3 and the nMOS transistors N2 and N3. In the latch L1, when the shift control signal SC has a high level (the shift control signal /SC has a low level), the output level, which is input to the loop circuit composed of the pMOS transistors P2 and P3 and the nMOS transistors N2 and N3, is transferred to the loop circuit, composed of the pMOS transistors P5 and P6 and the nMOS transistors N5 and N6, from which the output LO1 of the output level is output.

In addition, in the latch L1, when the reset signal /RST has a low level, the output level, which is input to the loop circuit composed of the pMOS transistors P2 and P3 and the nMOS transistors N2 and N3, is initialized to a high level as the pMOS transistor PR1 is turned on. In addition, the shift control signals SC and /SC are fixed to a low level and a high level, respectively, when the reset signal /RST has a low level. Accordingly, after completion of the initialization by the reset signal /RST, the latch L1 outputs the output LO1 of the high level in response to initial shift control signals SC and /SC.

Figure 4:
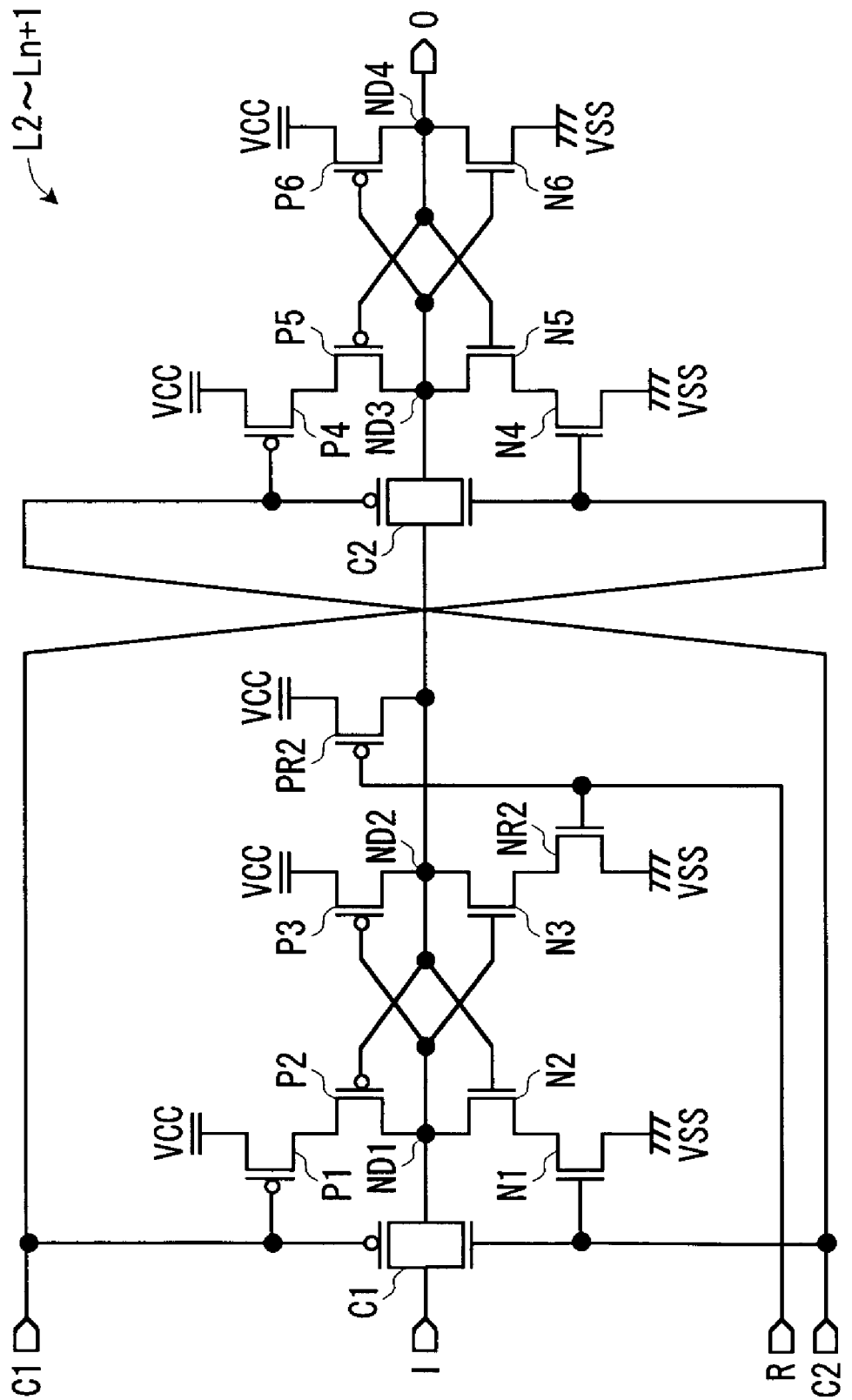
FIG. 4 is a circuit diagram illustrating details of a latch initialized to an inactivation state of the shift register according to the first embodiment.

FIG. 4 illustrates details of the latch L2 to Ln+1 initialized to an inactivation state of the shift register 22 according to the first embodiment.

Each latch L2 to Ln+1 further includes a pMOS transistor PR2 and an nMOS transistor NR2 instead of the pMOS transistor PR1 and the nMOS transistor NR1 of the latch L1 (FIG. 3).

A source electrode of the nMOS transistor N1 is connected to the ground line VSS. The pMOS transistor PR2 is connected between the power supply and the connection node ND2. The nMOS transistor NR2 is connected between the nMOS transistor N3 and the ground line VSS. Gate electrodes of the pMOS transistor PR2 and the nMOS transistor NR2 receive the reset signal /RST supplied from the power-on reset circuit 18 (FIG. 1).

In each latch L2 to Ln+1 constructed as above, like the latch L1, when the shift control signal SC has a low level (the shift control signal /SC has a high level), an output level of a latch at a previous stage (the latch L1 to Ln) is input to the loop circuit composed of the pMOS transistors P2 and P3 and the nMOS transistors N2 and N3. In each latch L2 to Ln+1, when the shift control signal SC has a high level (the shift control signal /SC has a low level), the output level, which is input to the loop circuit composed of the pMOS transistors P2 and P3 and the nMOS transistors N2 and N3, is transferred to the loop circuit, composed of the pMOS transistors P5 and P6 and the nMOS transistors N5 and N6, from which the outputs LO2 to LOn+1 of the output level are output.

In addition, in each latch L2 to Ln+1, when the reset signal /RST has a low level, the output level, which is input to the loop circuit composed of the pMOS transistors P2 and P3 and the nMOS transistors N2 and N3, is initialized to a low level as the pMOS transistor PR2 is turned on. Accordingly, after completion of the initialization by the reset signal /RST, each latch L2 to Ln+1 outputs each output LO2 to LOn+1 of the low level in response to initial shift control signals SC and /SC.

Figure 5:
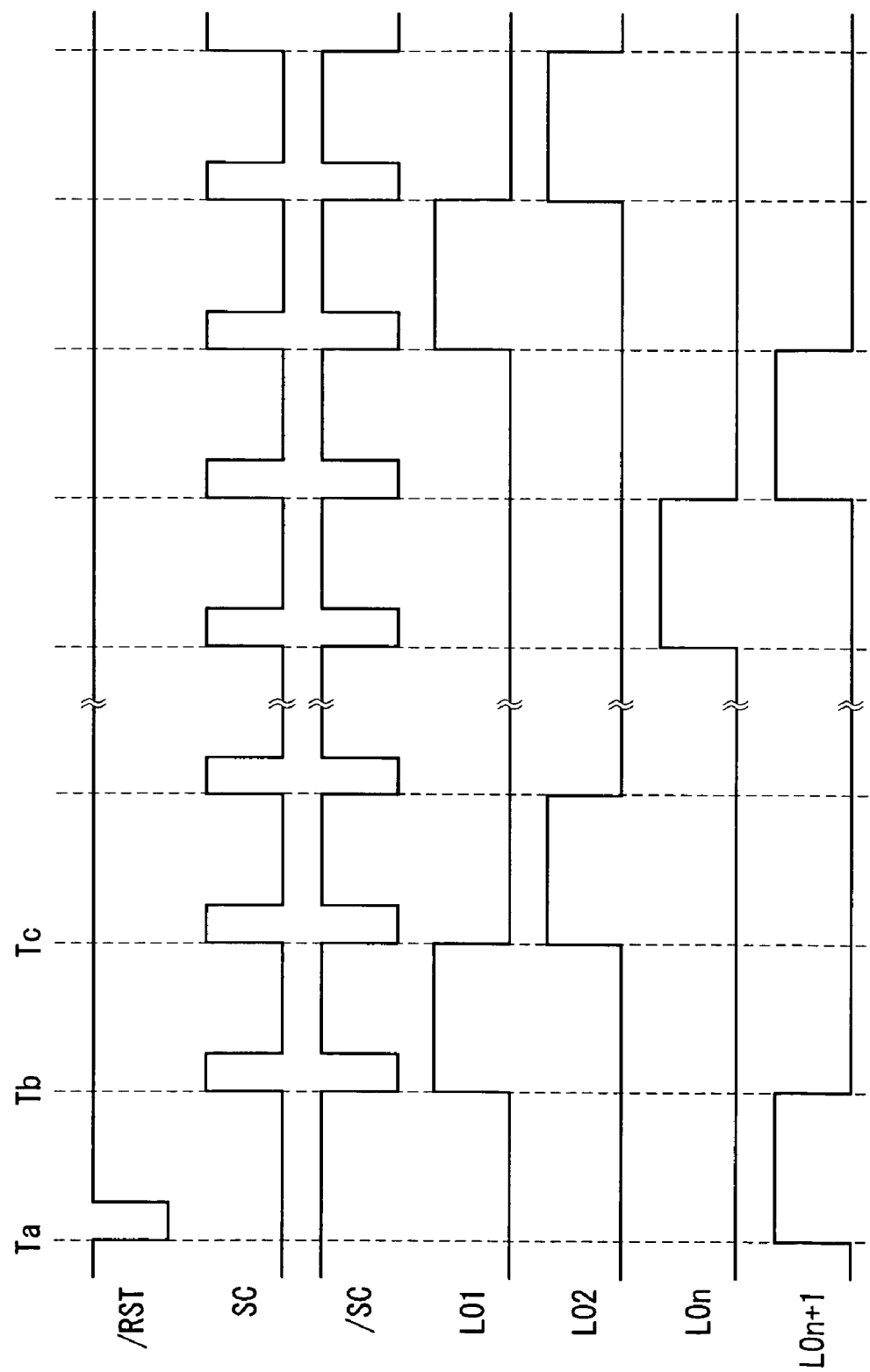
FIG. 5 is a timing chart illustrating a shift operation of the shift register according to the first embodiment.

FIG. 5 illustrates a shift operation of the shift register 22 according to the first embodiment.

At time Ta, when the reset signal /RST supplied from the power-on reset circuit 18 (FIG. 1) is changed to a low level, the output LOn+1 of the latch Ln+1 (an input of the latch L1) is initialized to a high level since the latch L1 is initialized to an activation state. On the other hand, since the latches L2 to Ln+1 are initialized to an inactivation state, the outputs LO1 to LOn of the latches L1 to Ln (inputs of the latches L2 to Ln+1) are initialized to a low level.

At time Tb, when the shift control signals SC and /SC supplied from the shift control circuit 20 (FIG. 1) are changed to a high level and a low level, respectively, only the output LO1 of the latch L1 is changed to a high level since the latches L1 to Ln+1 output the output levels of the latches at previous stages, which are received up to the time Tb.

At time Tc, when the shift control signals SC and /SC are again changed to a high level and a low level, respectively, since the latches L1 to Ln+1 output the output levels of the latches at previous stages, which are received up to the time Tc, the output LO1 of the latch L1 is changed to a low level and the output LO2 of the latch L2 is changed to a high level. That is, a shift operation of the shift register 22 is carried out. Accordingly, as the shift control signals SC and /SC are repeatedly output, the outputs LO1 to LOn+1 of the latches L1 to Ln+1 are sequentially changed to a high level.

Figure 6:
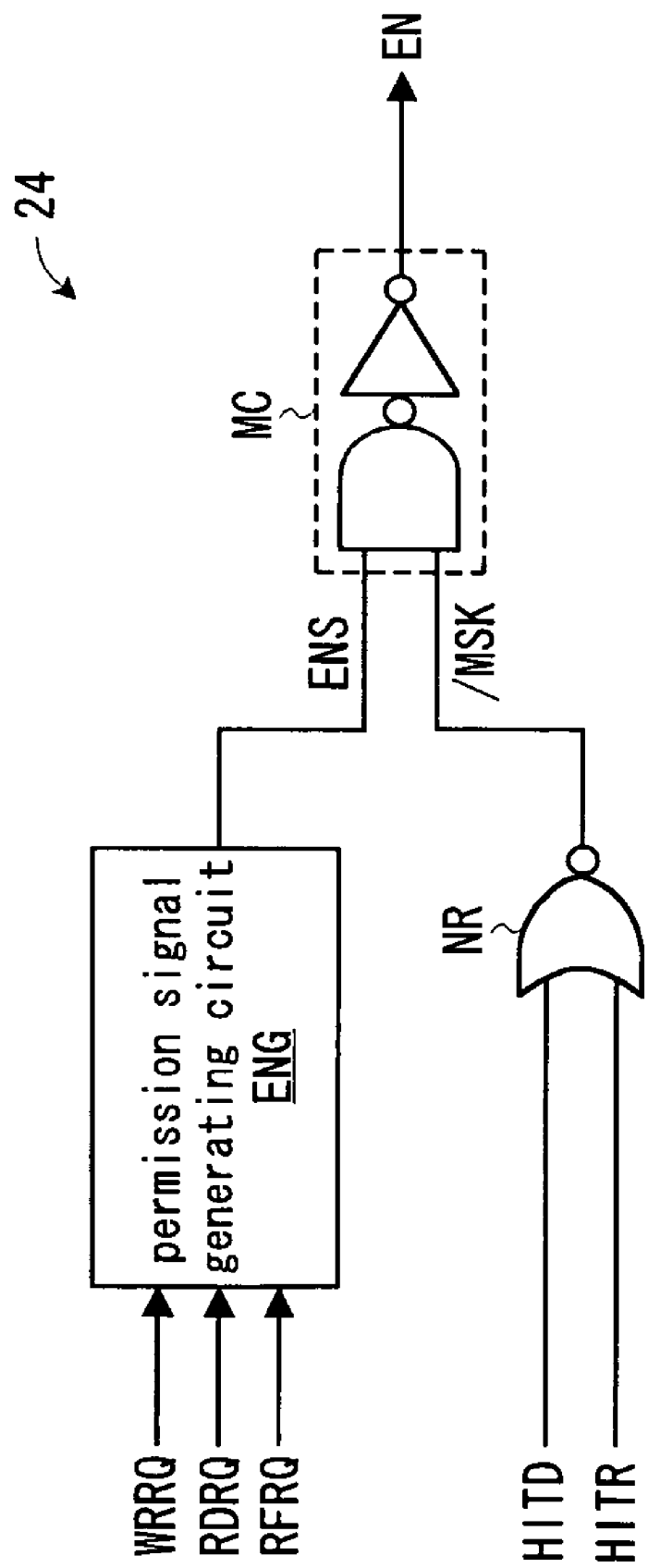
FIG. 6 is a circuit diagram illustrating details of a permission circuit according to the first embodiment.

FIG. 6 illustrates details of the permission circuit 24 according to the first embodiment.

The permission circuit 24 includes a permission signal generating circuit ENG, a mask circuit MC, and a NOR gate NR.

The permission signal generating circuit ENG generates a permission signal ENS in response to the write request signal WRRQ, the read request signal RDRQ, and the refresh request signal RFRQ, which are supplied from the operation control circuit 14 (FIG. 1). The NOR gate NR performs a NOR operation for the defect coincidence signal HITD and the redundancy coincidence signal HITR, which are supplied from the shift register 22 (FIG. 1), and outputs a result of the NOR operation as a mask signal /MSK. The mask circuit MC is composed of a NAND gate and an inverter, which are connected in series to each other, and outputs the permission signal ENS as a permission signal EN when the mask signal /MSK has a high level (the defect coincidence signal HITD and the redundancy coincidence signal HITR have the same low level). The mask circuit MC fixes the permission signal EN to a low level when the mask signal /MSK has a low level (one of the defect coincidence signal HITD and the redundancy coincidence signal HITR has a high level).

In the following description, a self-refresh operation according to the first embodiment will be described for use and nonuse of the redundancy memory cell row RR.

Figure 7:
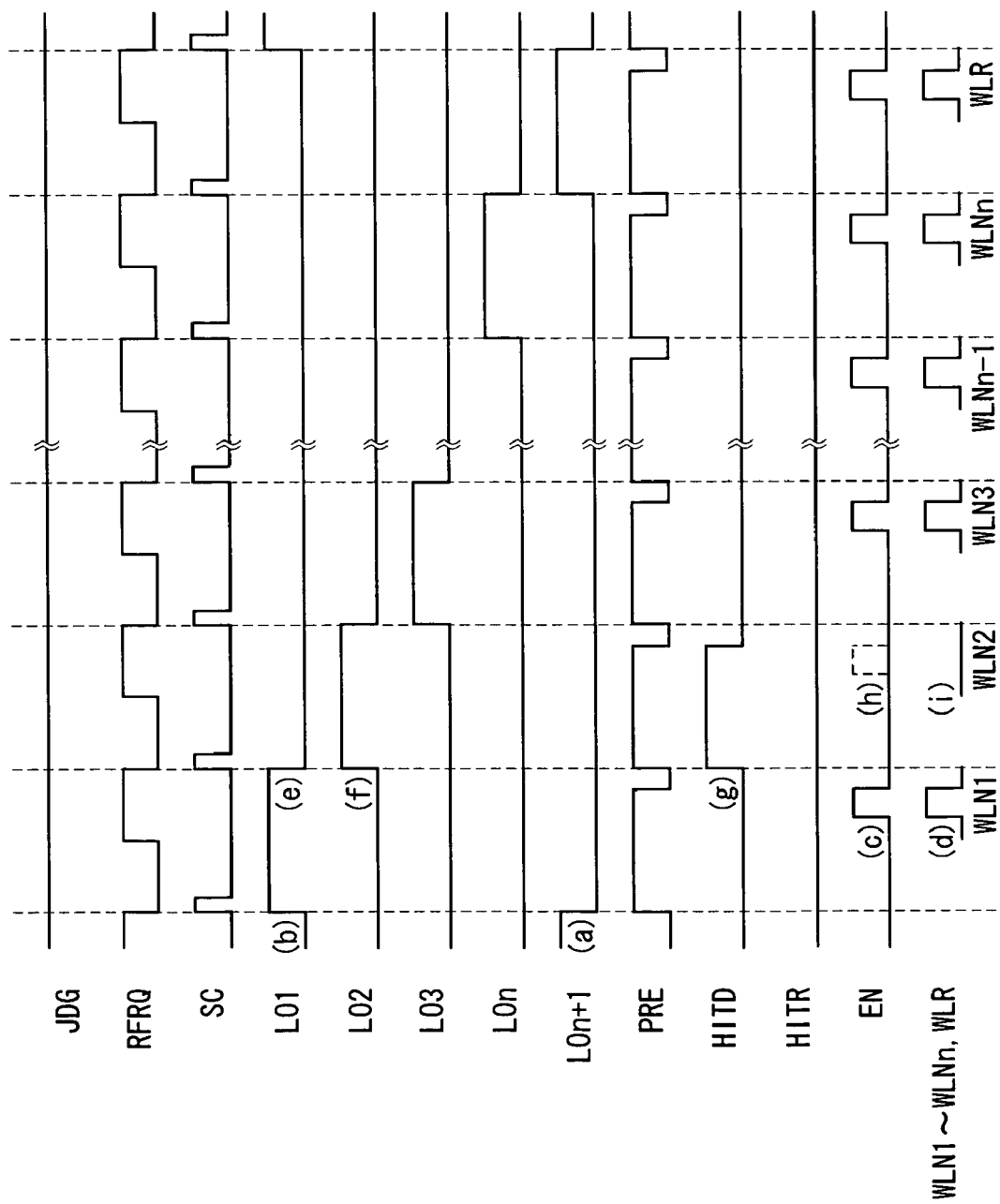
FIG. 7 is a timing chart illustrating a self-refresh operation when a redundancy memory cell row is used, according to the first embodiment.

FIG. 7 illustrates a self-refresh operation when the redundancy memory cell row RR is used, according to the first embodiment. In this example, there is a defect in the normal memory cell row RN2. That is, the defect address signal DAD indicates the normal memory cell row RN2. Since the defect is present in the normal memory cell row RN2, the use judgment signal JDG is fixed to a high level. During a self-refresh mode, as the self-refresh signal SRF is activated, the refresh request signal RFRQ is repeatedly output.

When the shift control signal SC is output in response to a falling edge of the refresh request signal RFRQ, the output LOn+1 of the shift register 22 is changed to a low level in response to a rising edge of the shift control signal SC ((a) in FIG. 7). On the other hand, the output LO1 of the shift register 22 is changed to a high level in response to the rising edge of the shift control signal SC ((b) in FIG. 7). That is, a word line indicated by the outputs LO1 to LOn+1 of the shift register 22 is changed to the normal word line WLN1. Since the defect address signal DAD indicates the normal memory cell row RN2, the defect coincidence signal HITD is not changed from a low level even when the output LO1 of the shift register 22 is changed to a high level. For this reason, the permission signal EN is output in response to a rising edge of the refresh request signal RFRQ ((c) in FIG. 7). Accordingly, as the normal word line WLN1 is activated, a refresh operation for the normal memory cell row RN1 is carried out ((d) in FIG. 7).

After the normal word line WLN1 is activated, when the shift control signal SC is output in response to a next falling edge of the refresh request signal RFRQ, the output LO1 of the shift register 22 is changed to a low level in response to the rising edge of the shift control signal SC ((e) in FIG. 7). On the other hand, the output LO2 of the shift register 22 is changed to a high level in response to the rising edge of the shift control signal SC ((f) in FIG. 7). That is, a word line indicated by the outputs LO1 to LOn+1 of the shift register 22 is changed to the normal word line WLN2. Since the defect address signal DAD indicates the normal memory cell row RN2, the defect coincidence signal HITD is changed to a high level in response to a rising edge of the output LO2 of the shift register 22 ((g) in FIG. 7). For this reason, the permission signal EN does not respond to the rising edge of the refresh request signal RFRQ, and accordingly, is not changed from a low level ((h) in FIG. 7). Accordingly, the normal word line WLN2 of the defective normal memory cell row RN2 is prevented from being activated ((i) in FIG. 7). As a result, a refresh operation for the defective normal memory cell row RN2 is prohibited, and accordingly, a charge and discharge current in the refresh operation is not unnecessarily consumed. That is, power consumption during the self-refresh mode is reduced when the redundancy memory cell row RR is used.

Figure 8:
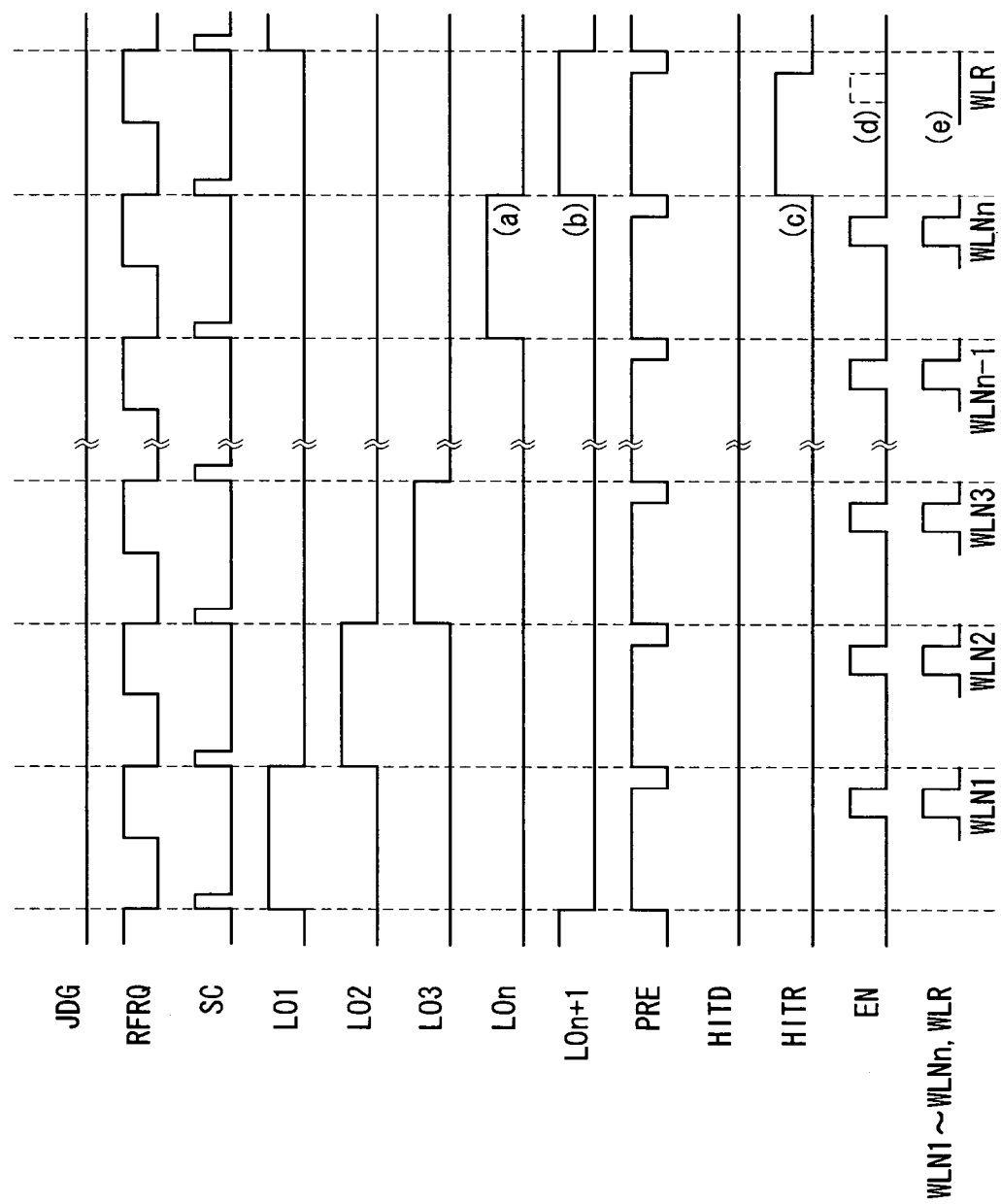
FIG. 8 is a timing chart illustrating a self-refresh operation when the redundancy memory cell row is not used, according to the first embodiment.

FIG. 8 illustrates a self-refresh operation when the redundancy memory cell row RR is not used, according to the first embodiment. Detailed explanation of the same operation as the self-refresh operation shown in FIG. 7 when the redundancy memory cell row RR is used will be omitted. Since there is no defect in any normal memory cell rows RN1 to RNn, the use judgment signal JDG is fixed to a low level. During the self-refresh mode, as the self-refresh signal SRF is activated, the refresh request signal RFRQ is repeatedly output.

After the normal word lines WLN1 to WLNn are sequentially activated, when the shift control signal SC is output in response to a falling edge of the refresh request signal RFRQ, the output LOn of the shift register 22 is changed to a low level in response to the rising edge of the shift control signal SC ((a) in FIG. 8). On the other hand, the output LOn+1 of the shift register 22 is changed to a high level in response to the rising edge of the shift control signal SC ((b) in FIG. 8). That is, a word line indicated by the outputs LO1 to LOn+1 of the shift register 22 is changed to the redundancy word line WLR. Since the use judgment signal JDG indicates "nonuse", the redundancy coincidence signal HITR is changed to a high level in response to a rising edge of the output LOn+1 of the shift register 22 ((c) in FIG. 8). For this reason, the permission signal EN does not respond to the rising edge of the refresh request signal RFRQ, and accordingly, is not changed from a low level ((d) in FIG. 8). Accordingly, the redundancy word line WLR is prevented from being activated ((e) in FIG. 8). As a result, a refresh operation for the redundancy memory cell row RR is prohibited, and accordingly, a charge and discharge current in the refresh operation is not unnecessarily consumed. That is, power consumption during the self-refresh mode is reduced when the redundancy memory cell row RR is not used.

From the above description, the following advantages can be obtained in the first embodiment.

As the permission circuit 24 stops the output operation of the permission signal EN during the activation of the defect coincidence signal HITD and the redundancy coincidence signal HITR, a word line requiring no activation can be prevented from being activated. As a result, refresh of a memory cell row requiring no refresh can be prohibited and unnecessary consumption of a charge and discharge current in the refresh operation can be avoided. In addition, since the semiconductor memory 100 employs the shift refresh method, there is no need of a refresh address generating circuit and a switching circuit switching between an external address and a refresh address. Accordingly, increase of a chip size of the semiconductor memory 100 can be suppressed and the refresh operation can be carried out in a short time. Owing to no need of the refresh address generating circuit and the switching circuit and the prohibition of refresh of a memory cell row requiring no refresh, power consumption during the refresh operation can be reduced. For power consumption of the semiconductor memory 100 during the self-refresh mode, since the power consumption in the refresh operation is dominant, the invention is particularly effective in reduction of the power consumption during the self-refresh mode. In addition, since the normal word line WLN2 of the defective normal memory cell row RN2 is not activated, if the defect of the normal memory cell row RN2 is caused by the word decoder 28 or one of a short between the normal word lines, a short between the normal word line WLN2 and the bit line BL, and a short between the normal memory cells, stored data of other memory cell rows can be prevented from being destructed.

The defect coincidence signal HITD is generated using the wired OR circuit. For this reason, delay time of the defect coincidence signal HITD can be reduced as compared to a case where the defect coincidence signal HITD is generated using OR gates at a plurality of stages, and the defect coincidence signal HITD can be generated in a simple circuit.

The latches L1 to Ln+1 of the shift register 22 are connected in a loop shape. For this reason, after activation of the redundancy word line WLR corresponding to the latch Ln+1 at the last stage, the normal word lines can be again sequentially activated starting from the normal word line WLN1 corresponding to the latch L1 at the initial stage without performing a special process for activating the latch L1 at the initial stage. In addition, since the latch L1 is initialized to an activation state in response to the reset signal /RST and the latches L2 to Ln+1 are initialized to an inactivation state in response to the reset signal /RST, the reset signal /RST has only to be once supplied to the shift register 22 when the semiconductor memory 100 is powered on, without re-initialization of the shift register 22.

Figure 9:
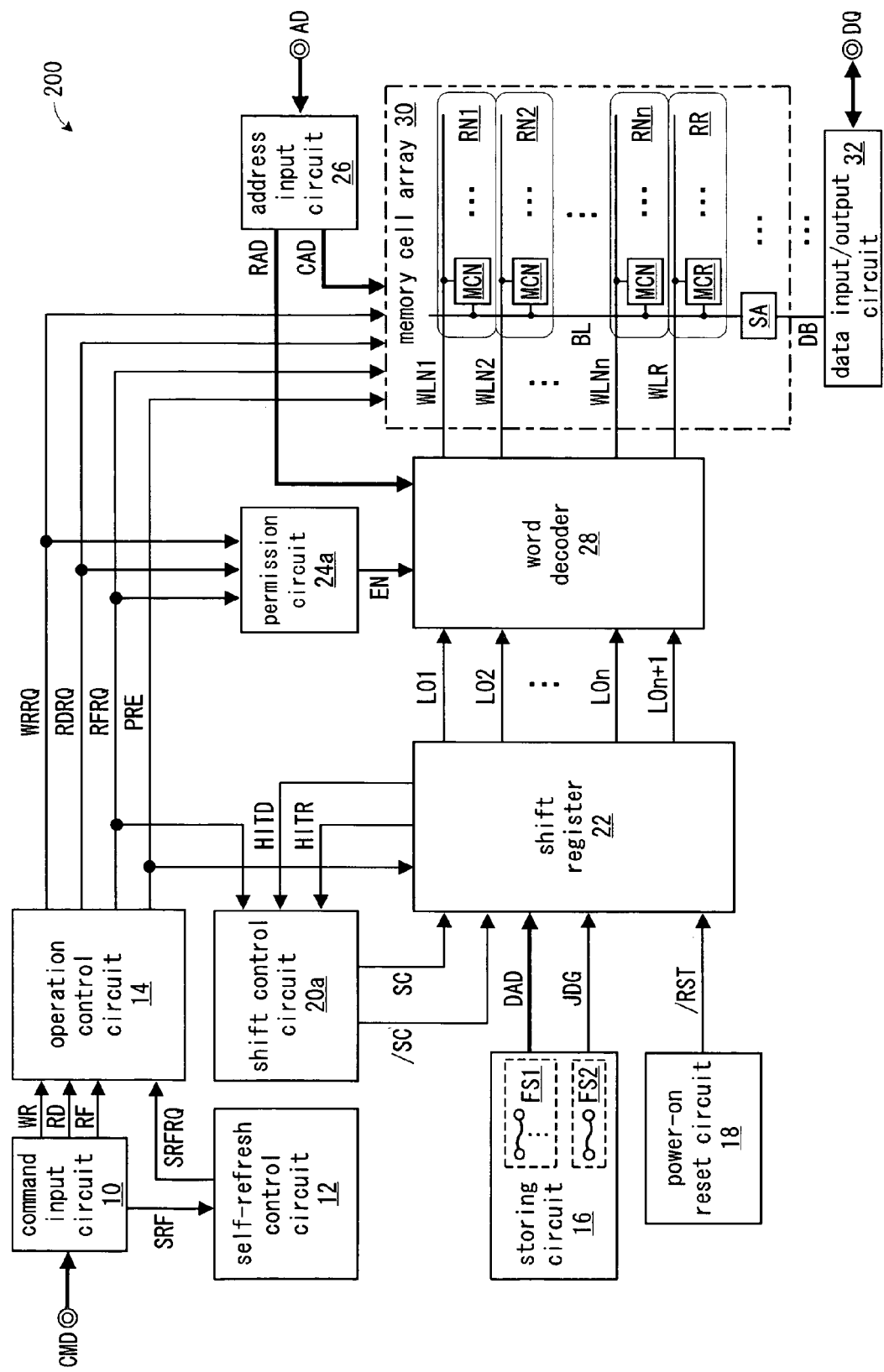
FIG. 9 is a block diagram illustrating a semiconductor memory according to a second embodiment of the invention.

FIG. 9 illustrates a semiconductor memory according to a second embodiment of the invention. In the second embodiment, the same elements as the first embodiment are denoted by the same reference numerals, and detailed explanation thereof will be omitted.

A semiconductor memory 200 includes a shift control circuit 20a and a permission circuit 24a instead of the shift control circuit 20 and the permission circuit 24 of the first embodiment. Besides, the semiconductor memory 200 includes the same elements as the semiconductor memory 100 of the first embodiment.

When the defect coincidence signal HITD and the redundancy coincidence signal HITR, which are supplied from the shift register 22, are not activated, the shift control circuit 20a (first and second activation control circuits) outputs the shift control signals SC and /SC once for causing the shift register 22 to perform the shift operation in response to the refresh request signal RFRQ supplied from the operation control circuit 14. When one of the defect coincidence signal HITD and the redundancy coincidence signal HITR is activated, the shift control circuit 20a consecutively outputs the shift control signals SC and /SC twice in response to the refresh request signal RFRQ. Details of the shift control circuit 20a will be described with reference to FIG. 10.

The permission circuit 24a outputs a permission signal EN for activating the word decoder 28 in response to the write request signal WRRQ, the read request signal RDRQ and the refresh request signal RFRQ, irrespective of the defect coincidence signal HITD and the redundancy coincidence signal HITR.

Figure 10:
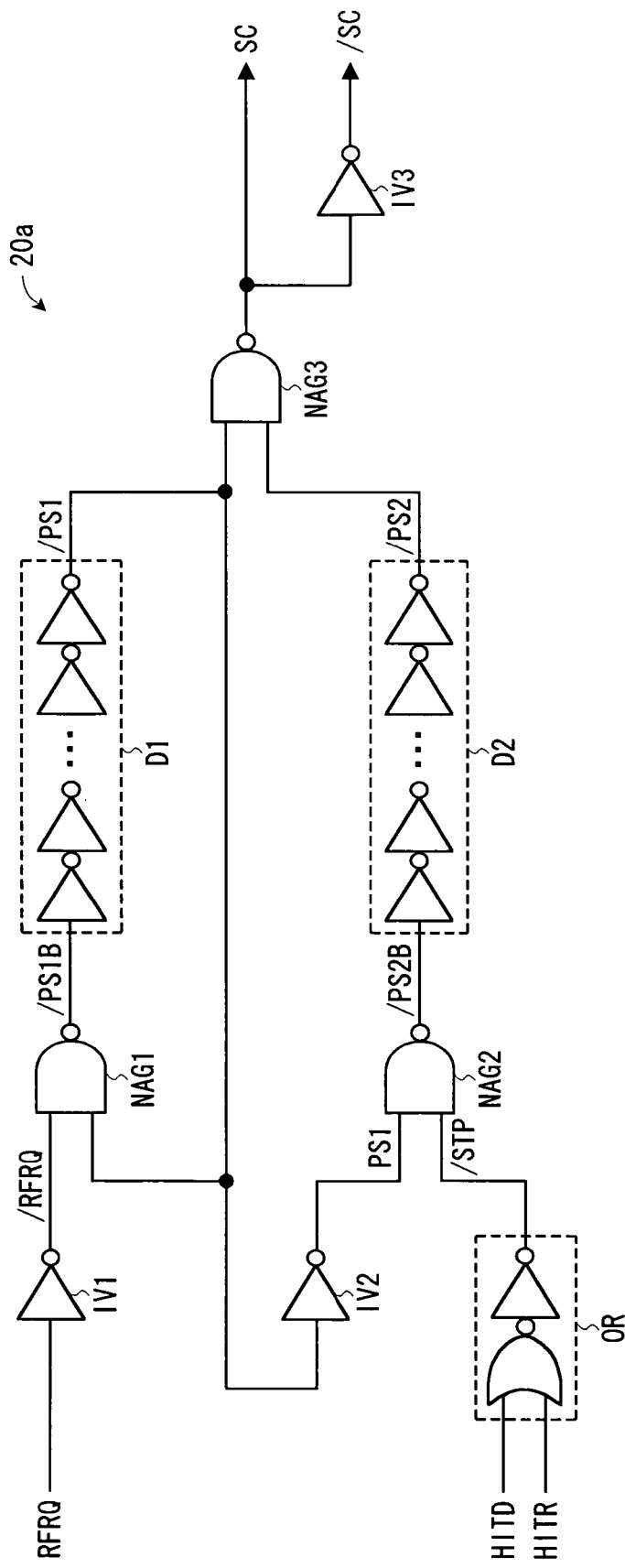
FIG. 10 is a circuit diagram illustrating details of a shift control circuit according to the second embodiment.

FIG. 10 illustrates details of the shift control circuit 20a according to the second embodiment.

The shift control circuit 20a includes inverters IV1 to IV3, NAND gates NAG1 to NAG3, delay circuits D1 and D2, and an OR circuit OR. Delay time of the inverter IV2, the NAND gate NAG2, and the delay circuits D1 and D2 is sufficiently large as compared to delay time of other circuits.

The inverter IV1 inverts the refresh request signal RFRQ supplied from the operation control circuit 14 (FIG. 9) and outputs the inverted refresh request signal /RFRQ. The delay circuit D1 is composed of a series of inverters at even stages and outputs a first pulse reference signal /PS1B supplied from the NAND gate NAG1 as a first pulse signal /PS1. One input of the NAND gate NAG1 receives the refresh request signal /RFRQ. The other input of the NAND gate NAG1 receives the first pulse signal /PS1. That is, an output of the NAND gate NAG1 is fed back to the other input of the NAND gate NAG1 through the first delay circuit D1. For this reason, the first pulse reference signal /PS1B is changed to a low level in response to a falling edge of the refresh request signal RFRQ, and then is changed to a high level after delay time of the delay circuit D1 elapses.

The inverter IV2 inverts the first pulse signal /PS1 and outputs a first pulse signal PS1. The OR circuit OR is composed of a NOR gate and an inverter, which are connected in series, performs an OR operation for the defect coincidence signal HITD and the redundancy coincidence signal HITR, which are supplied from the shift register 22 (FIG. 9), and outputs a result of the OR operation as a stop signal /STP. When the stop signal /STP has a high level (one of the defect coincidence signal HITD and the redundancy coincidence signal HITR has a high level), the NAND gate NAG2 inverts the first pulse signal PS1 and outputs a second pulse reference signal /PS2B. When the stop signal /STP has a low level (both of the defect coincidence signal HITD and the redundancy coincidence signal HITR have a low level), the NAND gate NAG2 fixes the second pulse reference signal /PS2B to a high level. The delay circuit D2 is composed of a series of inverters at even stages, delays the second pulse reference signal /PS2B, and outputs the delayed second pulse reference signal /PS2B as a second pulse signal /PS2.

The NAND gate NAG3 performs a NAND operation for the first pulse signal /PS1 and the second pulse signal /PS2 and outputs a result of the NAND operation as the shift control signal SC. The inverter IV3 inverts the shift control signal SC and outputs the inverted shift control signal /SC.

Figure 11:
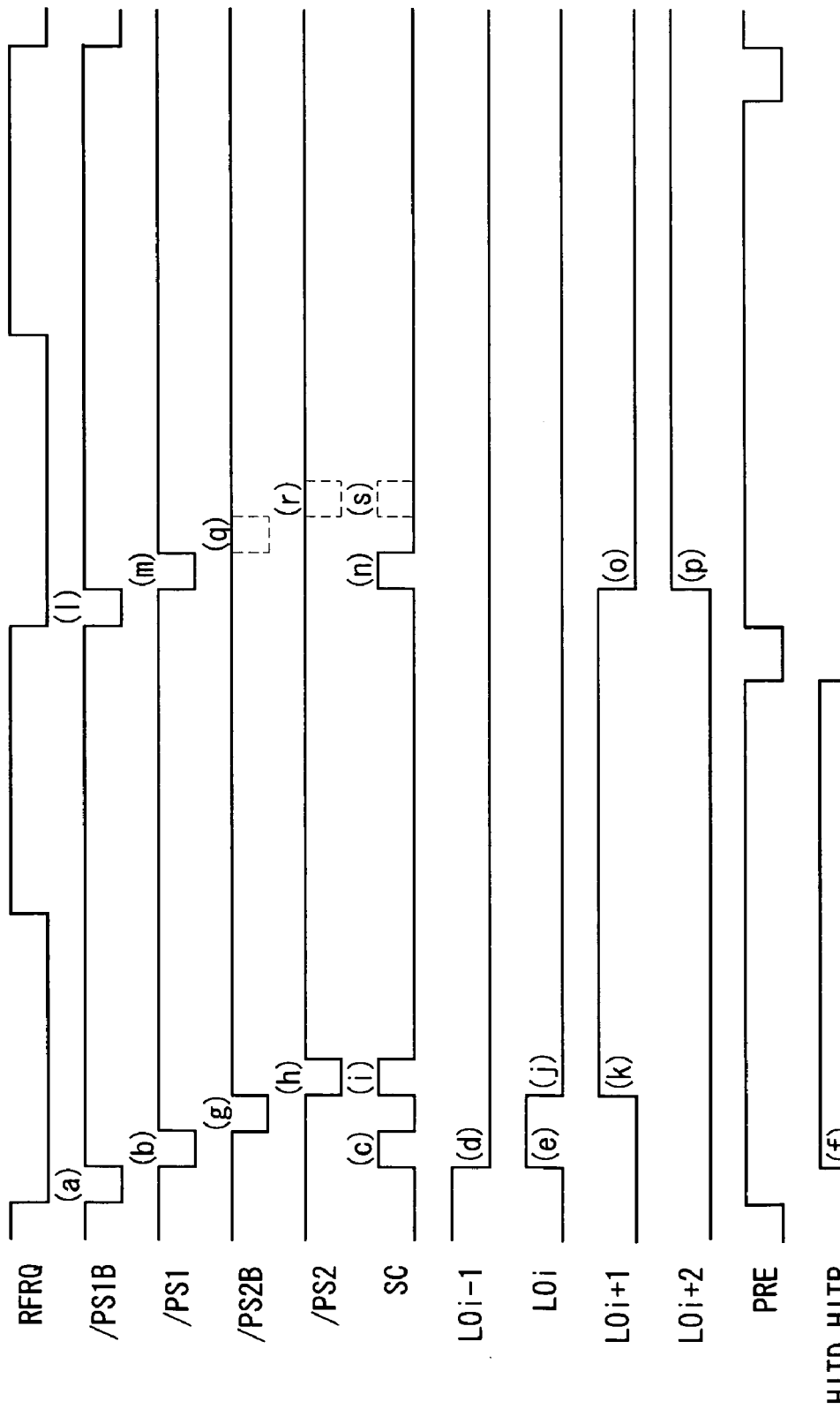
FIG. 11 is a timing chart illustrating a shift control signal generating operation of the sift control circuit according to the second embodiment.

FIG. 11 illustrates a generating operation of the shift control signals SC and /SC in the sift control circuit 20a according to the second embodiment. In this example, the delay circuits D1 and D2 (FIG. 10) have the same delay time TD. A latch Li (any one of the latches L1 to Ln+1) of the shift register 22 corresponds to a memory cell row requiring no refresh.

The first pulse reference signal /PS1B is changed to a low level in response to a falling edge of the refresh request signal RFRQ, and then is changed to a high level after the delay time TD elapses ((a) in FIG. 11). The first pulse signal /PS1 is changed to a low level in synchronization with a falling edge of the first pulse reference signal /PS1B, and then is changed to a high level after the delay time TD elapses ((b) in FIG. 11). Accordingly, the shift control signal SC is changed to a high level in synchronization with a falling edge of the first pulse signal /PS1, and then is changed to a low level after the delay time TD elapses ((c) in FIG. 11). The output LOi−1 of the shift register 22 is changed to a low level in response to a rising edge of the shift control signal SC ((d) in FIG. 11). On the other hand, the output LOi of the shift register 22 is changed to a high level in response to the rising edge of the shift control signal SC ((e) in FIG. 11). That is, a word line indicated by the outputs LO1 to LOn+1 of the shift register 22 is changed to a word line requiring no activation. For this reason, one of the defect coincidence signal HITD and the redundancy coincidence signal HITR is changed to a high level in response to a rising edge of the output LOi of the shift register 22 ((f) in FIG. 11).

Since one of the defect coincidence signal HITD and the redundancy coincidence signal HITR is activated, after the first pulse signal /PS1 is changed to a low level, the second pulse reference signal /PS2B is changed to a low level after the delay time of the inverter IV2 and the NAND gate NAG2 elapses, and then is changed to a high level after the delay time TD elapses ((g) in FIG. 11). The second pulse signal /PS2 is changed to a low level in synchronization with a falling edge of the second pulse reference signal /PS2B, and then is changed to a high level after the delay time TD elapses ((h) in FIG. 11). Accordingly, the shift control signal SC is changed to a high level in synchronization with a falling edge of the second pulse signal /PS2, and then is changed to a low level after the delay time TD elapses ((i) in FIG. 11). That is, the shift control signal SC is consecutively output twice until the refresh request signal RFRQ is changed to a high level. As a result, the output LOi of the shift register 22 is changed to a low level in response to the rising edge of the shift control signal SC ((j) in FIG. 11). On the other hand, the output LOi+1 of the shift register 22 is changed to a high level in response to the rising edge of the shift control signal SC ((k) in FIG. 11). Accordingly, a word line indicated by the outputs LO1 to LOn+1 of the shift register 22 is immediately changed to a next word line without activation of a word line requiring no activation.

The first pulse reference signal /PS1B is changed to a low level in response to a next falling edge of the refresh request signal RFRQ, and then is changed to a high level after the delay time TD elapses ((l) in FIG. 11). The first pulse signal /PS1 is changed to a low level in synchronization with the falling edge of the first pulse reference signal /PS1B, and then is changed to a high level after the delay time TD elapses ((m) in FIG. 11). Accordingly, the shift control signal SC is changed to a high level in synchronization with the falling edge of the first pulse signal /PS1, and then is changed to a low level after the delay time TD elapses ((n) in FIG. 11). The output LOi+1 of the shift register 22 is changed to a low level in response to the rising edge of the shift control signal SC ((o) in FIG. 11). On the other hand, the output LOi+2 of the shift register 22 is changed to a high level in response to the rising edge of the shift control signal SC ((p) in FIG. 11). That is, a word line indicated by the outputs LO1 to LOn+1 of the shift register 22 is changed to a next word line. Since the defect coincidence signal HITD and the redundancy coincidence signal HITR are not activated, the second pulse reference signal /PS2B is not changed from a high level ((q) in FIG. 11). For this reason, the second pulse signal /PS2 is not changed from a high level ((r) in FIG. 11). Accordingly, the shift control signal SC is not changed from a low level ((s) in FIG. 11). That is, the shift control signal SC is output only once until the refresh request signal RFRQ is changed to a high level.

In the following description, a self-refresh operation according to the second embodiment will be described for use and nonuse of the redundancy memory cell row RR.

Figure 12:
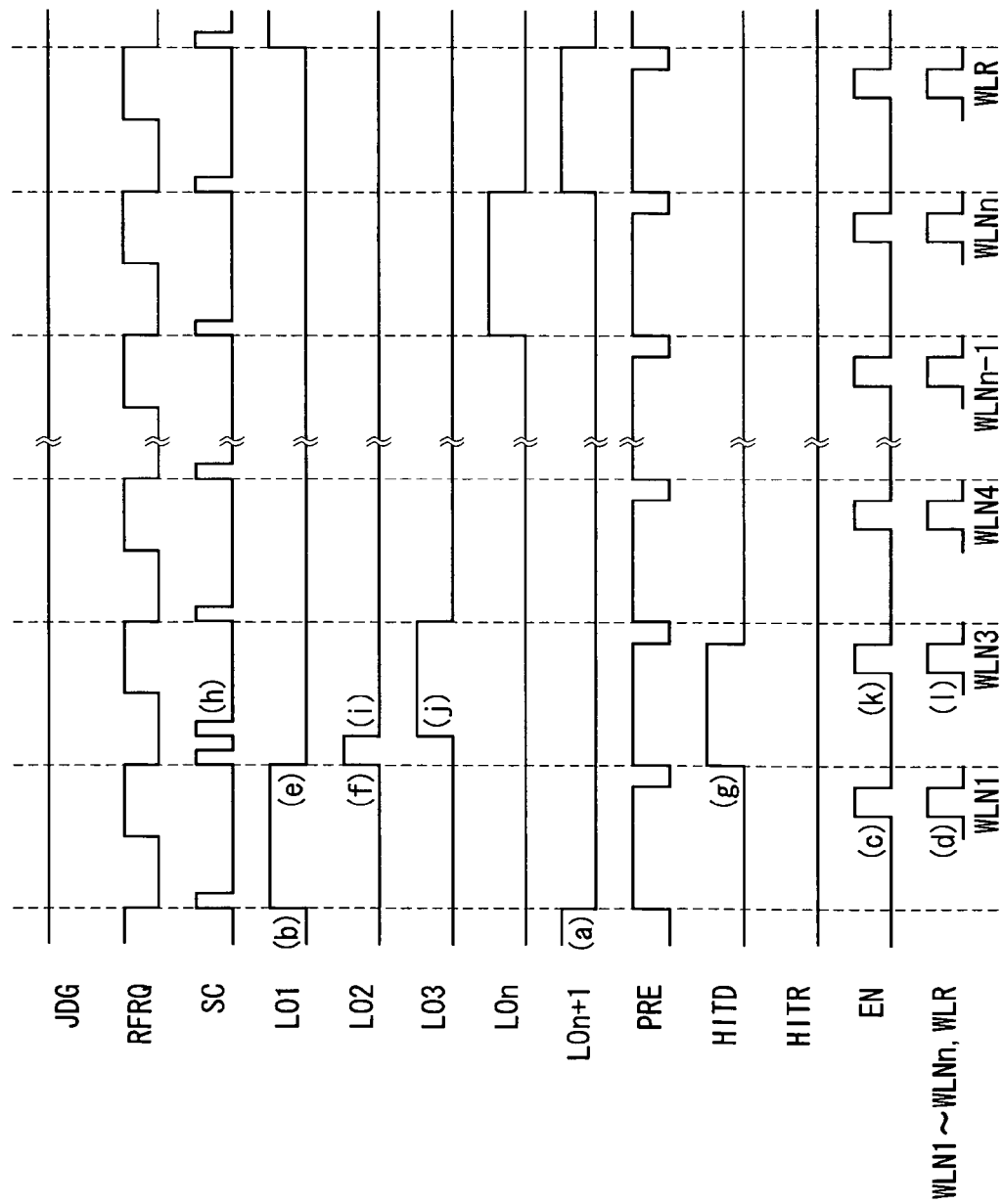
FIG. 12 is a timing chart illustrating a self-refresh operation when a redundancy memory cell row is used, according to the second embodiment.

FIG. 12 illustrates a self-refresh operation when the redundancy memory cell row RR is used, according to the second embodiment. In this example, like the first embodiment (FIG. 7), there is a defect in the normal memory cell row RN2. That is, the defect address signal DAD indicates the normal memory cell row RN2. Since the defect is present in the normal memory cell row RN2, the use judgment signal JDG is fixed to a high level. During a self-refresh mode, as the self-refresh signal SRF is activated, the refresh request signal RFRQ is repeatedly output.

When the shift control signal SC is output in response to a falling edge of the refresh request signal RFRQ, the output LOn+1 of the shift register 22 is changed to a low level in response to a rising edge of the shift control signal SC ((a) in FIG. 12). On the other hand, the output LO1 of the shift register 22 is changed to a high level in response to the rising edge of the shift control signal SC ((b) in FIG. 12). That is, a word line indicated by the outputs LO1 to LOn+1 of the shift register 22 is changed to the normal word line WLN1. Since the defect address signal DAD indicates the normal memory cell row RN2, the defect coincidence signal HITD is not changed from a low level even when the output LO1 of the shift register 22 is changed to a high level. For this reason, the shift control signal SC is output only once until the refresh request signal RFRQ is changed to a high level. The permission signal EN is output in response to a rising edge of the refresh request signal RFRQ, irrespective of the defect coincidence signal HITD ((c) in FIG. 12). Accordingly, as the normal word line WLN1 is activated, a refresh operation for the normal memory cell row RN1 is carried out ((d) in FIG. 12).

After the normal word line WLN1 is activated, when the shift control signal SC is output in response to a next falling edge of the refresh request signal RFRQ, the output LO1 of the shift register 22 is changed to a low level in response to the rising edge of the shift control signal SC ((e) in FIG. 12). On the other hand, the output LO2 of the shift register 22 is changed to a high level in response to the rising edge of the shift control signal SC ((f) in FIG. 12). That is, a word line indicated by the outputs LO1 to LOn+1 of the shift register 22 is changed to the normal word line WLN2. Since the defect address signal DAD indicates the normal memory cell row RN2, the defect coincidence signal HITD is changed to a high level in response to a rising edge of the output LO2 of the shift register 22 ((g) in FIG. 12). For this reason, the shift control signal SC is again output until the refresh request signal RFRQ is changed to a high level ((h) in FIG. 12). As a result, the output LO2 of the shift register 22 is changed to a low level in response to the rising edge of the shift control signal SC ((i) in FIG. 12). On the other hand, the output LO3 of the shift register 22 is changed to a high level in response to the rising edge of the shift control signal SC ((j) in FIG. 12). That is, a word line indicated by the outputs LO1 to LOn+1 of the shift register 22 is again changed to the normal word line WLN3 until the refresh request signal RFRQ is changed to a high level. The permission signal EN is output in response to a rising edge of the refresh request signal RFRQ, irrespective of the defect coincidence signal HITD ((k) in FIG. 12). Accordingly, as the normal word line WLN3 is activated without activation of the normal word line WLN2, a refresh operation for the normal memory cell row RN3 is carried out ((l) in FIG. 12). That is, the normal word line WLN2 of the defective normal memory cell row RN2 is prevented from being activated. As a result, a refresh operation for the defective normal memory cell row RN2 is prohibited, and accordingly, a charge and discharge current in the refresh operation is not unnecessarily consumed. That is, power consumption during the self-refresh mode is reduced when the redundancy memory cell row RR is used.

In addition, since the normal word line WLN3 is activated at a timing when the normal word line WLN2 is inherently activated, the number of times of output of the refresh request signal RFRQ required to refresh the memory cell array 30 is reduced by one time. Moreover, since the frequency of activation of a generating circuit of the self-refresh request signal SRFRQ in the self-refresh control circuit 12 is reduced, power consumption during the self-refresh mode is further reduced when the redundancy memory cell row RR is used, as compared to the first embodiment.

Figure 13:
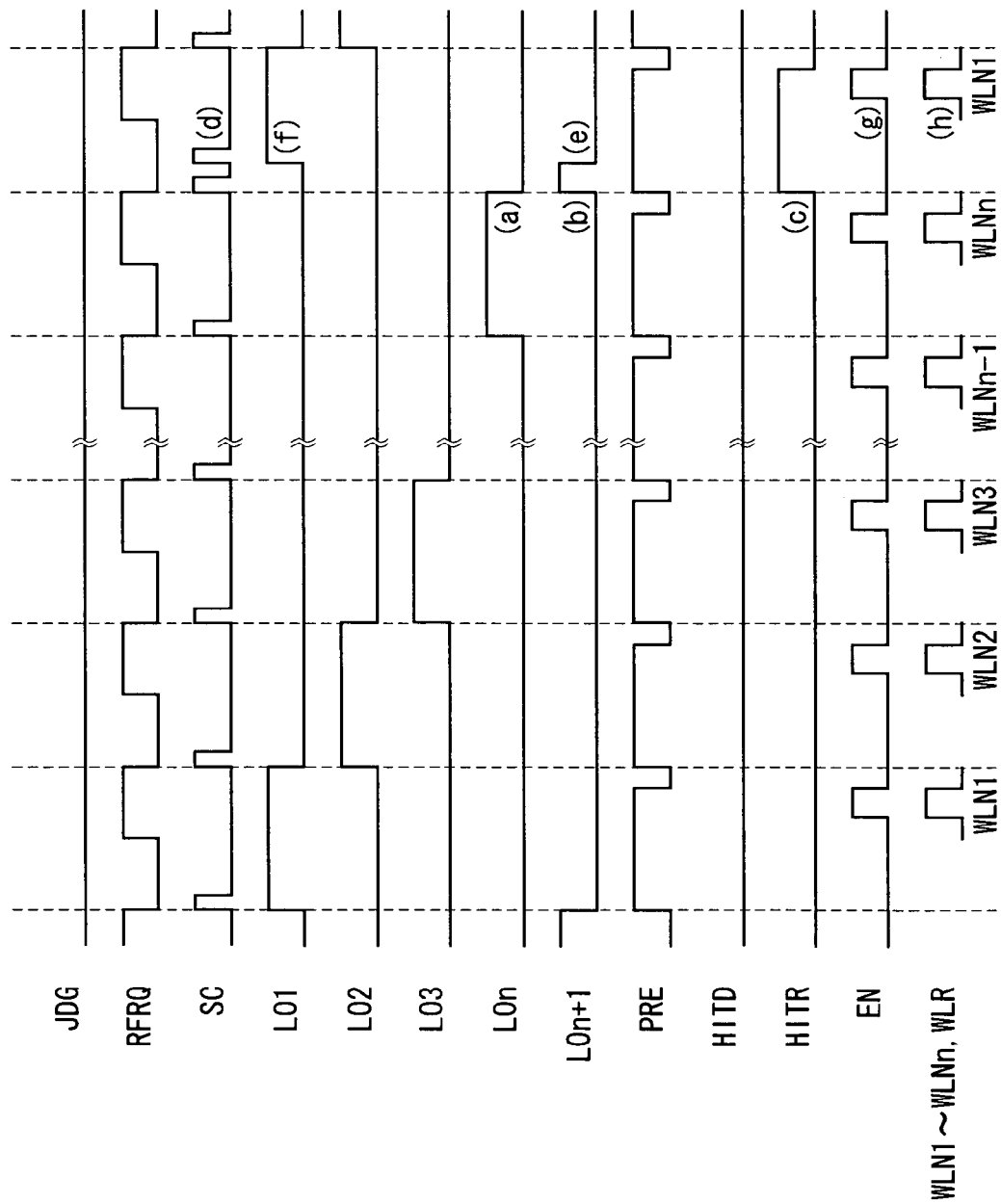
FIG. 13 is a timing chart illustrating a self-refresh operation when the redundancy memory cell row is not used, according to the second embodiment.

FIG. 13 illustrates a self-refresh operation when the redundancy memory cell row RR is not used, according to the second embodiment. Detailed explanation of the same operation as the self-refresh operation shown in FIG. 12 when the redundancy memory cell row RR is used will be omitted. Since there is no defect in any normal memory cell rows RN1 to RNn, the use judgment signal JDG is fixed to a low level. During the self-refresh mode, as the self-refresh signal SRF is activated, the refresh request signal RFRQ is repeatedly output.

After the normal word lines WLN1 to WLNn are sequentially activated, when the shift control signal SC is output in response to a falling edge of the refresh request signal RFRQ, the output LOn of the shift register 22 is changed to a low level in response to the rising edge of the shift control signal SC ((a) in FIG. 13). On the other hand, the output LO2 of the shift register 22 is changed to a high level in response to the rising edge of the shift control signal SC ((b) in FIG. 13). That is, a word line indicated by the outputs LO1 to LOn+1 of the shift register 22 is changed to the redundancy word line WLR. Since the use judgment signal JDG indicates "nonuse", the redundancy coincidence signal HITR is changed to a high level in response to a rising edge of the output LOn+1 of the shift register 22 ((c) in FIG. 13). For this reason, the shift control signal SC is again output until the refresh request signal RFRQ is changed to a high level ((d) in FIG. 13). As a result, the output LOn+1 of the shift register 22 is changed to a low level in response to the rising edge of the shift control signal SC ((e) in FIG. 13). On the other hand, the output LO1 of the shift register 22 is changed to a high level in response to the rising edge of the shift control signal SC ((f) in FIG. 13). That is, a word line indicated by the outputs LO1 to LOn+1 of the shift register 22 is again changed to the normal word line WLN1 until the refresh request signal RFRQ is changed to a high level. The permission signal EN is output in response to a rising edge of the refresh request signal RFRQ, irrespective of the defect coincidence signal HITD ((g) in FIG. 13). Accordingly, as the normal word line WLN1 is activated without activation of the redundancy word line WLR, a refresh operation for the normal memory cell row RN1 is carried out ((h) in FIG. 13). That is, the redundancy word line WLR is prevented from being activated. As a result, a refresh operation for the redundancy memory cell row RR is prohibited, and accordingly, a charge and discharge current in the refresh operation is not unnecessarily consumed. That is, power consumption during the self-refresh mode is reduced when the redundancy memory cell row RR is not used.

In addition, since the normal word line WLN1 is activated at a timing when the redundancy word line WLR is inherently activated, the number of times of output of the refresh request signal RFRQ required to refresh the memory cell array 30 is reduced by one. Moreover, since the frequency of activation of a generating circuit of the self-refresh request signal SRFRQ in the self-refresh control circuit 12 is reduced, power consumption during the self-refresh mode is further reduced when the redundancy memory cell row RR is not used, as compared to the first embodiment.

From the above description, the second embodiment can obtain the same effect as the first embodiment. In addition, since the shift control circuit 20a consecutively outputs the shift control signals SC and /SC twice when one of the defect coincidence signal HITD and the redundancy coincidence signal HITR is activated, a word line indicated by the outputs LO1 to LOn+1 of the shift register 22 is immediately changed to a next word line without activation of a word line requiring no activation. As a result, the number of times of output of the refresh request signal RFRQ required to refresh the entire memory cell array 30 can be reduced and the frequency of outputs of the refresh request signal RFRQ can be reduced. In addition, since the frequency of activation of the generating circuit of the self-refresh request signal SRFRQ in the self-refresh control circuit 12 is reduced, power consumption during the self-refresh mode is further reduced as compared to the first embodiment.

While it has been illustrated in the first and second embodiments that the invention is applied to the DRAM, the invention is not limited to these embodiments. For example, the invention may be applied to a pseudo static RAM (SRAM).

The invention is not limited to the above embodiments and various modifications may be made without departing from the spirit and scope of the invention. Any improvement may be made in part or all of the components.

What is claimed is:

1. A semiconductor memory comprising:
   a memory cell array including a plurality of normal memory cell rows and a redundancy memory cell row, each of said normal memory cell rows including a normal word line and a normal memory cell connected to said normal word line, said redundancy memory cell row including a redundancy word line and a redundancy memory cell that both relieve defects of said normal memory cell rows, the redundancy memory cell being connected to said redundancy word line;
   a shift register composed of a plurality of latches corresponding to said normal word lines and said redundancy word line, respectively, in order to sequentially activate any of said redundancy word line and said normal word lines upon every refresh request;
   an activation circuit that activates any of said redundancy word line and said normal word lines according to an output of said shift register;
   a first storing circuit that stores in advance a defect address indicating a defective normal memory cell row when there is a defect in any of said normal memory cell rows;
   a first comparing circuit that activates a defect coincidence signal when the output of said shift register indicates the normal word line corresponding to said defect address stored in said first storing circuit;
   a first activation control circuit that prohibits activation of a normal word line corresponding to said defect address stored in said first storing circuit, in response to the activation of said defect coincidence signal.

2. The semiconductor memory according to claim 1, wherein
   said first activation control circuit includes a permission circuit that stops an output operation of a permission signal during activation of said defect coincidence signal and that outputs said permission signal during inactivation of said defect coincidence signal, the permission signal being for activating said activation circuit.

3. The semiconductor memory according to claim 2, wherein said first comparing circuit includes:
   a plurality of decoders provided corresponding to said latches respectively and receiving said defect address stored in said first storing circuit and then outputting coincidence detection signals when a latch corresponding to said defect address is activated; and
   a wired OR circuit that activates said defect coincidence signal when one of said coincidence detection signals is output.

4. The semiconductor memory according to claim 2, wherein said permission circuit includes:
   a permission signal generating circuit that generates said permission signal in response to said refresh request or an access request; and
   a mask circuit that masks said permission signal during the activation of said defect coincidence signal.

5. The semiconductor memory according to claim 1, wherein
   said first activation control circuit includes a shift control circuit that outputs a shift control signal once in response to said refresh request when said defect coincidence signal is not activated, and that consecutively outputs said shift control signal twice in response to said refresh request when said defect coincidence signal is activated, the shift control signal being for making said shift register perform a shift operation.

6. The semiconductor memory according to claim 5, wherein said first comparing circuit includes:
   a plurality of decoders provided corresponding to said latches respectively and receiving said defect address stored in said first storing circuit and then outputting coincidence detection signals when a latch corresponding to said defect address is activated; and
   a wired OR circuit that activates said defect coincidence signal when one of said coincidence detection signals is output.

7. The semiconductor memory according to claim 5, wherein said shift control circuit includes:
   a first pulse generating circuit that outputs a first pulse signal in response to said refresh request;
   a second pulse generating circuit that outputs a second pulse signal not overlapping with said first pulse signal, when said defect coincidence signal is activated; and
   an OR circuit that performs an OR operation on said first and second pulse signals to output a result of said OR operation as said shift control signal.

8. The semiconductor memory according to claim 7, wherein said second pulse generating circuit includes:
   a delay circuit that outputs said first pulse signal with a delay as said second pulse signal; and
   a prohibition circuit that prohibits said first pulse signal from being supplied to said delay circuit during inactivation of said defect coincidence signal.

9. The semiconductor memory according to claim 1, further comprising:
   a second storing circuit that stores use/nonuse of said redundancy memory cell row in advance; and
   a second activation control circuit that prohibits activation of said redundancy word line when said second storing circuit stores the nonuse of said redundancy memory cell row and the output of said shift register indicates said redundancy word line.

10. The semiconductor memory according to claim 9, further comprising
a second comparing circuit that activates a redundancy coincidence signal when said second storing circuit stores the nonuse of said redundancy memory cell row and the output of said shift register indicates said redundancy word line, wherein
said second activation control circuit includes a permission circuit that stops an output operation of a permission signal during activation of said redundancy coincidence signal and outputs said permission signal during inactivation of said redundancy coincidence signal, the permission signal being for activating said activation circuit.

11. The semiconductor memory according to claim 10, wherein said permission circuit includes:
a permission signal generating circuit that generates said permission signal in response to said refresh request or an access request; and
a mask circuit that masks said permission signal during the activation of said redundancy coincidence signal.

12. The semiconductor memory according to claim 9, further comprising
a second comparing circuit that activates a redundancy coincidence signal when said second storing circuit stores the nonuse of said redundancy memory cell row and the output of said shift register indicates said redundancy word line, wherein
said second activation control circuit includes a shift control circuit that outputs a shift control signal once in response to said refresh request when said redundancy coincidence signal is not activated, and that consecutively outputs said shift control signal twice in response to said refresh request when said redundancy coincidence signal is activated, the shift control signal being for making said shift register perform a shift operation.

13. The semiconductor memory according to claim 12, wherein said shift control circuit includes:
a first pulse generating circuit that outputs a first pulse signal in response to said refresh request;
a second pulse generating circuit that outputs a second pulse signal not overlapping with said first pulse signal, when said redundancy coincidence signal is activated; and
an OR circuit that performs an OR operation on said first and second pulse signals to output a result of said OR operation as said shift control signal.

14. The semiconductor memory according to claim 13, wherein said second pulse generating circuit includes:
a delay circuit that outputs said first pulse signal with a delay as said second pulse signal; and
a prohibition circuit that prohibits said first pulse signal from being supplied to said delay circuit during inactivation of said redundancy coincidence signal.

15. The semiconductor memory according to claim 9, wherein:
said first storing circuit includes a first fuse circuit that programs said defect address; and
said second storing circuit includes a second fuse circuit that programs use/nonuse of said redundancy memory cell row.

16. The semiconductor memory according to claim 1, further comprising
a self-refresh control circuit that generates said refresh request at a predetermined cycle to automatically refresh said normal memory cells and said redundancy memory cell at the predetermined cycle.

17. The semiconductor memory according to claim 1, wherein
an output of a latch at a last stage of said latches is fed back to an input of a latch at the initial stage of said latches.

18. The semiconductor memory according to claim 17, wherein:
each of said latches includes a reset terminal that receives a reset signal;
one of said latches is initialized to an activation state in response to said reset signal; and
the rest of said latches are initialized to an inactivation state in response to said reset signal.

19. The semiconductor memory according to claim 1, wherein
said first storing circuit includes a first fuse circuit that programs said defect address.

* * * * *